United States Patent
Augusto

(10) Patent No.: US 7,521,737 B2
(45) Date of Patent: Apr. 21, 2009

(54) LIGHT-SENSING DEVICE

(75) Inventor: Carlos J. R. P. Augusto, San Jose, CA (US)

(73) Assignee: Quantum Semiconductor LLC, San Jose, CA (US)

(*) Notice: Subject to any disclaimer, the term of this patent is extended or adjusted under 35 U.S.C. 154(b) by 183 days.

(21) Appl. No.: 11/070,721

(22) Filed: Mar. 2, 2005

(65) Prior Publication Data

US 2005/0167709 A1   Aug. 4, 2005

Related U.S. Application Data

(63) Continuation of application No. PCT/EP2003/010346, filed on Sep. 15, 2003.

(60) Provisional application No. 60/412,139, filed on Sep. 19, 2002.

(51) Int. Cl.
*H01L 21/00* (2006.01)

(52) U.S. Cl. .................. 257/233; 257/292; 257/184; 257/186; 257/438; 257/440; 257/444; 257/465; 257/466; 257/E31.063

(58) Field of Classification Search .............. 257/184, 257/186, 458, 233, 438, 440, 444, 465, 466, 257/292, E31.063
See application file for complete search history.

(56) References Cited

U.S. PATENT DOCUMENTS 5,625,729 A   4/1997  Brown 6,943,051 B2 *  9/2005  Augusto et al. ............... 435/58

FOREIGN PATENT DOCUMENTS

WO   WO 02 33755   4/2002

OTHER PUBLICATIONS

XP000005661, Apr. 1, 1988, Aubert.
XP006012681, Sep. 16, 1999, Heide.
XP000362935, Mar. 1, 1993, Noriyoshi.

* cited by examiner

*Primary Examiner*—Eugene Lee
(74) *Attorney, Agent, or Firm*—Sturm & Fix LLP

(57) ABSTRACT

A method of fabricating light-sensing devices including photodiodes monolithically integrated with CMOS devices. Several types of photodiode devices (PIN, HIP) are expitaxially grown in one single step on active areas implanted in a common semiconductor substrate, the active areas having defined polarities. The expitaxially grown layers for the photodiode devices may be either undoped or in-situ doped with profiles suitable for their respective operation. With appropriate choice of substrate materials, device layers and heterojunction engineering and process architecture, it is possible to fabricate silicon-based and germanium-based multi-spectral sensors that can deliver pixel density and cost of fabrication comparable to the state of the art CCDs and CMOS image sensors. The method can be implemented with epitaxially deposited films on the following substrates: Silicon Bulk, Thick-Film and Thin-Film Silicon-On-Insulator (SOI), Germanium Bulk, Thick-Film and Thin-Film Geranium-On-Insulator (GeOI).

14 Claims, 20 Drawing Sheets

LIGHT-SENSING DEVICE

CROSS REFERENCE TO RELATED APPLICATIONS

This application is a Continuation application of PCT/EP2003/010346 filed Sep. 15, 2003, claiming priority of U.S. Patent Application No. 60/412,139 filed Sep. 19, 2002, which are included in their entirety by reference made hereto.

BACKGROUND OF THE INVENTION

The present invention relates to methods of optical to electronic conversion, in particular to photo-detection with devices suitable for integration with Complementary Metal Oxide Semiconductor (CMOS) technology.

The devices and fabrication technologies used for light-sensing are highly dependent on the frequency or wavelength of the light to be sensed. Usually, for imaging purposes, the spectrum is divided into:

Ultra-Violet (UV), wavelengths shorter than 0.4 μm
Visible, wavelengths in the range of 0.4 μm to 0.7 μm
Short-Wave Infra-Red (SWIR), wavelengths in the range of 1 μm to 3 μm
Mid-Wave Infra-Red (MWIR), wavelengths in the range of 3 μm to 5 μm
Long-Wave Infra-Red (LWIR), wavelengths in the range of 8 μm to 12 μm
Very Long-Wave Infra-Red (VLWIR), wavelengths longer than 20 μm For wavelengths in the visible range, a wide range of devices and materials can be used, with the most common types being silicon pn-junction photo-diodes, either in CCDs or CMOS image sensors. For UV detection, it is usually desirable to have "solar-blind" detection, i.e., absorption of UV without absorption of the visible wavelengths. This can be achieved with pn-junction or heterojunction photo-diodes made with materials whose bandgap energy is larger than the energy of the photons with wavelengths in the visible range. Examples of such materials are Silicon-Carbide (SiC), GaN, AlGaN, AlN, ZnO, etc. It is also possible to have solar-blind detection with thinned CCDs. These devices make use of the fact that the coefficient of absorption of most materials, including silicon, increases for shorter wavelengths. Therefore, solar-blind UV detection is achieved by reducing the thickness of the light sensing material, so that the signal generated by visible light is much weaker that the signal generated by UV light. Yet another possibility for solar-blind UV detection is to place a visible-blocking filter in front of the light-sensing elements.

The sensing of the different IR bands of wavelengths can be approached with very different devices, operating under different physical mechanisms, typically with very different materials systems.

The SWIR band includes the 1.310 μm and the 1.550 μm ranges of wavelengths that are used for fiber-optics communications. These wavelengths can be absorbed by pn-junction or heterojunction photo-diodes made with Germanium (Ge) or Indium-Phosphide (InP). It has been shown that SiGe and/or SiGeC random alloys and/or superlattices can also detect these signals.

The MWIR band can be approached by devices operating on band-to-band transitions, such as pn-junction and heterojunction photodiodes, provided that the materials used have a small enough bandgap, for example HgCdTe. Other devices, such as Quantum Well Infrared Photodetectors (QWIPs) can also be used. QWIP devices operate with intersubband transitions, i.e., transitions between discrete energy levels either in the conduction-band or in the valence-band of quantum wells. Some common materials employed are GaAs—AlGaAs, InGaAs—InAlAs, InGaAs—InP, GaAs—GaInP, GaAs—AlInP, etc. Another physical mechanism employed for the detection of these wavelengths is the Heterojunction Internal Photoemission (HIP). This mechanism can be implemented with semiconductor-semiconductor heterojunctions or with metal-semiconductor heterojunctions (also known as Schottky-diodes). The barrier height at the heterojunction determines the longest wavelength possible to detect. QWIPs and HIP devices are unipolar and can be designed to operate with either electrons or holes. The performance of all these different types of devices can be significantly increased by lowering the temperature of operation. Typical temperatures for the HIP devices are around 77K (liquid nitrogen cooling).

The LWIR band can be sensed with essentially the same devices used for the MWIR, but with the appropriate fine-tuning of the device-parameters. For devices based on band-to-band transitions this requires a decrease in band gap energy, for QWIP devices this requires the energy difference between the quantized levels to be decreased, that is, the width of the quantum well to be increased, and for HIP devices the heterojunction or Schottky "barrier height" needs to be decreased. All these result increased noise and decreased performance of the light-detection, which can be counter-acted by further decreasing the operating temperature.

The VLWIR band can be covered by some of the devices mentioned for LWIR, including HIP devices, but all need to operate at very low temperatures of around 4K (liquid helium cooling). In addition, there is another physical mechanism that is used for these wavelengths: excitation of doping impurities. The energy levels of doping elements are usually very close to either the conduction band or the valence band of the host semiconductor (Si, Ge, GaAs, etc.). At room temperature the doping impurities can be taken to be fully ionized. The energy difference between in the "band of impurities" and the host semiconductor corresponds to the energy of photons in this band. At very low temperature, the impurities remain neutral and the host semiconductor remains "intrinsic". Therefore, photons can excite the impurities and inject carries into the energy bands of the host semiconductor, thereby producing a detectable signal.

Multispectral and hyperspectral imaging, covering at least some of the spectral bands mentioned above, offer many interesting possibilities for the retrieval, processing and subsequent display, of data that the human eyes cannot perceive, and that can have a wide range of applications. It has been very challenging to fabricate monolithically integrated sensors for the different wavelength bands (multi-spectral sensors), having pixel density and cost of fabrication comparable with the state of the art commercial CCDs and CMOS image sensors. The main reason for this situation is the lack of suitable device/materials and process architectures capable of fabricating sensors covering most of the spectral ranges mentioned above.

Image sensing in different ranges of wavelengths requires different types of photo-detectors. The differences between photo-detectors range from materials system, device physics, device architecture, mode of operation, etc. The reason behind this diversity in photo-detection technologies is due to, firstly, all the possible different approaches to tackle the physics involved in the absorption of photons of a particular wavelength, and secondly, what are the best technologies for each range of wavelengths of interest.

Conventional photo-detectors covering the wavelengths in the visible range, such as Charge Coupled Devices (CCDs), CMOS photo-diodes and CMOS photo-gates are made on silicon substrates and involve what are called "band to band transitions" in which electron-hole pairs are generated. For this type of photo-detection a photon is absorbed by scattering one electron from the valence band to the conduction band, thus creating a "hole" in the valence band.

There is strong interest in "solar-blind" or "visible-blind" UV photo-detection for which photo-detectors made with wide band-gap materials such as SiC (Silicon Carbide) or GaN (Gallium Nitride) have been demonstrated. Such materials have band-gaps larger than the energy of the photons in the visible range, and therefore band-to-band transitions cannot take place. Photons in the UV range of the spectrum have energy larger than the band-gap of these materials and can therefore generate electron-hole pairs through band-to-band transitions.

In the Infra-Red (IR) portion of the spectrum, the situation is little bit more complicated, as there are several distinct regions of the spectrum. Different technologies are under development to improve the performance for each of these wavelength intervals. For example, Silicon devices such as CCDs, pn-junction diodes or p-i-n (PIN) junction diodes, are capable of absorption in the SWIR band ($0.7 \mu m < \lambda < 1 \mu m$) and germanium devices can absorb wavelengths up to $1.6 \mu m$. For the MWIR range ($3 \mu m < \lambda < 5 \mu m$), Heterojunction Internal Photoemission (HIP) detectors making use of Schottky-junctions between p+-Silicon and PtSi (Platinum Silicide) seem to offer good performance. On the other hand the best performing devices and materials for LWIR ($8 \mu m < \lambda < 12 \mu m$) seem to be HgCdTe (Mercury Cadmium Telluride—MCT) photodiodes. For LWIR SiGe/Si HIP devices have also been fabricated but their performance seems considerably lower than that of MCT-based devices. As a result, sensors made with MCT can operate without cooling while the best SiGe/Si HIP devices require cooling to 77K.

The fact that each range of wavelength requires a different type of photo-detector and/or a different materials system, has made impossible the fabrication of 1D and/or 2D arrays (or focal planes) of "color" pixels capable of capturing multiple-wavelengths in the visible and invisible parts of the spectrum, such as UV, Visible, SWIR, MWIR, LWIR.

Conventional solutions include the sensing with separate cameras each with its own set of lenses, focal planes, along with all the required circuitry to produce still images and/or video signals. Hybrid schemes have been developed, in which there is a single set of lenses, but still require the splitting of the incoming light through prisms and wavelength filters onto different focal planes with the type of photo-detectors suitable for each desired range of wavelengths.

Having a single set of lenses and a single focal plane capable of image sensing in all the desired wavelengths would present an extraordinary advancement towards the goal of "sensor fusion". Therefore, it is of extreme relevance to develop a process flow for the fabrication of photo-detector devices suitable for monolithic integration with CMOS circuitry for 1D and/or 2D arrays of Passive-Pixel Sensors (PPS), and/or 1D and/or 2D arrays of Active-Pixel Sensors (APS), in which each pixel has multi-wavelength (visible and invisible) sensing capability. The present invention shows how to achieve this goal.

SUMMARY OF THE INVENTION

It is an object of the present invention to provide a method of fabricating light-sensing devices including photo-diodes monolithically integrated with CMOS devices on a common semiconductor substrate.

Another object of the invention is to provide a method of fabricating light-sensing devices including PIN and HIP photo-diode devices integrated with CMOS devices on a common semiconductor substrate and allowing the operational features of the devices to be tailored to suit various wavelength sensing requirements.

Yet another object of the invention is to provide a method of fabricating photo-detector devices including PIN and HIP photo-diode devices integrated with CMOS devices on a common semiconductor substrate and allowing the photo-diodes to be operated under Avalanche and Geiger modes.

A further object of this invention is to provide a method of fabricating a photo-detector device, in which the same device can be operated as a PIN photo-diode when a certain bias condition is applied, or can be operated as a HIP photo-diode when another particular bias condition is applied.

A further object of this invention is to provide a method of fabricating HIT cooling devices, fabricated directly on photo-detector devices including PIN and HIP photo-diode devices, all integrated with CMOS devices on a common semiconductor substrate.

According to the present invention, PIN and HIP photo-diode devices are simultaneously epitaxially grown on embedded well semiconductor regions implanted in a common semiconductor substrate, the PIN and HIP photo-diode devices being grown on surfaces having opposite doping polarities. The epitaxially grown layers for the PIN and HIP photo-diode devices may be either undoped or in-situ doped with profiles suitable for their respective operation.

With appropriate choice of substrate materials, device layers and heterojunction engineering and process architecture, it is possible to fabricate silicon-based and germanium-based multi-spectral sensors that can deliver pixel density and cost of fabrication comparable to the state of the art CCDs and CMOS image sensors. The present invention can be implemented with epitaxially deposited films on the following substrates: Silicon Bulk, Thick-Film and Thin-Film Silicon-On-Insulator (SOI), Germanium Bulk, Thick-Film and Thin-Film Germanium-On-Insulator (GeOI).

Photo-detector devices grown according to the invention are suitable for the realization of 1D and 2D arrays of Passive-Pixel Sensors (PPS), and also for the realization of 1D and 2D arrays of Active-Pixel Sensors (APS), in which each pixel has multi-wavelength (visible and invisible) sensing capability. Also, the invention permits to realize photo-sensing devices for front-side illumination as well as photo-sensing devices suitable for back-side illumination.

DESCRIPTION OF EXEMPLARY EMBODIMENTS OF THE INVENTION

Figure 1:
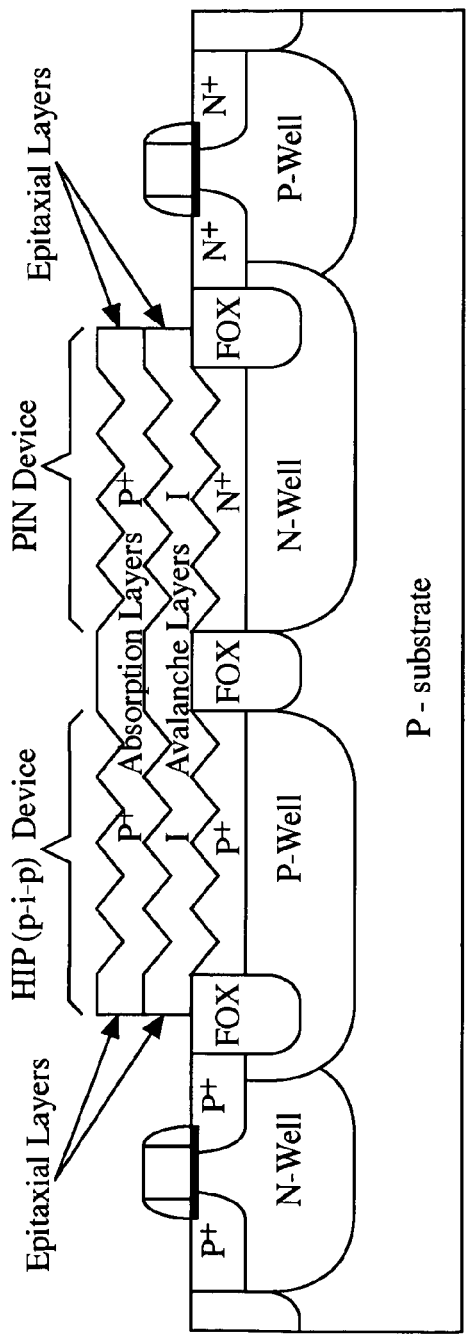
FIG. 1 shows a combination of PIN and HIP devices, side-by-side, monolithically integrated with CMOS devices, in which the PIN device is made on n+ active area. This configuration is meant for Front-Side Illumination.

The present invention uses a process architecture which enables the fabrication of bandgap and doping engineered photodiodes, monolithically integrated with state of the art CMOS transistors. The exemplary process flow uses a selective or non-selective epitaxial growth of the photo-diode device layers on silicon-based or germanium-based substrates.

Epitaxial growth of PIN photo-diode devices integrated with CMOS devices on a semiconductor substrate is disclosed in WO/EP01/11817. One of the many advantages of fabricating PIN (or PN) photodiodes through the epitaxial growth process step on active area "windows" formed on the CMOS wafer, is the straightforward incorporation of $Si_{1-x-y}Ge_xC_y$ alloys and/or superlattices during the epitaxial growth thereby allowing the improvement of different device parameters, such as coefficient of absorption and bandgap engineering, with respect to similar devices made with pure silicon. Such possibility is not available to pn-junctions formed in the bulk of the CMOS substrate, as is the case with conventional CCDs and CMOS image sensors.

For example, the incorporation of $Si_{1-x-y}Ge_xC_y$ random alloys and/or superlattices allows the cutoff wavelength to be extended to the 1.55 μm wavelength range, which is considered to be "eye safe" and is of high relevance for fiber optics communications. Also, for each wavelength from IR to UV, the coefficient of absorption of Ge is much larger than the coefficient of absorption of pure silicon. Therefore $Si_{1-x}Ge_x$ and $Si_{1-x-y}Ge_xC_y$ random alloys and/or superlattices benefit of increased coefficient of absorption with respect to pure silicon.

However, extending the detection into longer wavelengths, such as MWIR seems very difficult with optoelectronic transitions across the band-gap (band-to-band) of $Si_{1-x-y}Ge_xC_y$ random alloys and/or superlattices. Even though it has been predicted that the bandgap $Si_{1-y}C_y$ random alloys can be reduced to zero it does not seem, at this point in time, straightforward to implement in a CMOS production environment. LWIR seems totally out of the question for SiGeC random alloys, unless pure GeC or GeCSn alloys did produce extremely narrow bandgaps, because the carbon concentration in the $Si_{1-y}C_y$ alloys predicted to have nearly zero bandgap is, at the moment, too difficult to obtain in a manufacturing environment.

Photo-detector architectures such as the Heterojunction Internal Photoemission (HIP) devices, rather than PIN photodiodes, can also be implemented with $Si_{1-x-y}Ge_xC_y$ films, and can cover the 3-5 μm (MWIR) and the 8-12 μm (LWIR) ranges. That is because the physics of these two device types is very different. In HIP photo-detectors the optoelectronic transitions take place over a band offset (either conduction or valence) between two different materials, rather than from band-to-band within the same material. Therefore HIP devices are either p-i-p (light absorption by free holes) or n-i-n (light absorption by free electrons).

The obvious brute force approach to the fabrication of PIN and HIP types of detectors would be to perform two separate SEG process steps, each forming the layers necessary for each type of photo-detector. However, by carefully designing the doping and heterojunction profiles to be formed during the epitaxial growth, selective or non-selective, the same epitaxial layers can be used for PIN and HIP devices.

PIN devices are bipolar and thus require both types of doping, while HIP devices are unipolar and require only one kind of doping. A single epitaxial growth of the device layers for PIN and HIP (either p-i-p or n-i-n) photo-diodes is possible if the growth starts on silicon surfaces with complementary doping. Therefore, one kind of device is made on n+ active areas, while the other kind of device in p+ active areas. The epitaxially grown layers are either undoped or in-situ doped with profiles that are suitable for PIN and HIP devices.

Figure 2:
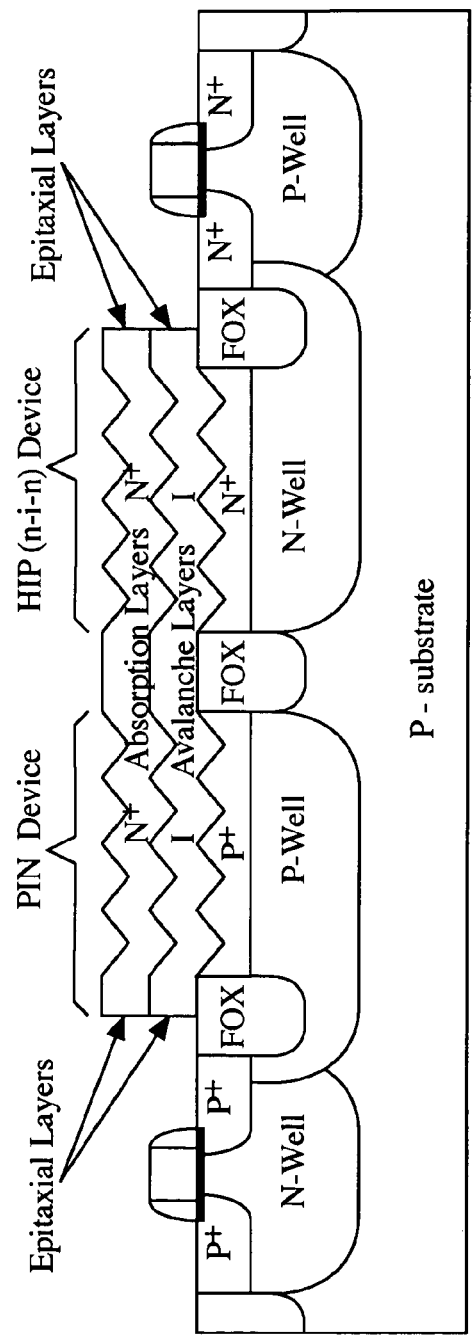
FIG. 2 shows a combination of PIN and HIP devices, side-by-side, monolithically integrated with CMOS devices, in which the PIN device is made on p+ active area. This configuration is meant for Front-Side Illumination.

Referring to FIG. 1 there is shown a first combination of PIN and HIP devices, in which the PIN device is made on n+ active area. Consequently the HIP device is implemented with p-i-p layers on a p+ active area. The top films of the PIN and HIP devices are p+ doped. FIG. 2 shows a combination of PIN and HIP devices, in which the PIN device is made on p+ active area. Consequently the HIP device is implemented with n-i-n layers on a n+ active area. The top films of the PIN and HIP devices are n+ doped.

Figure 3:
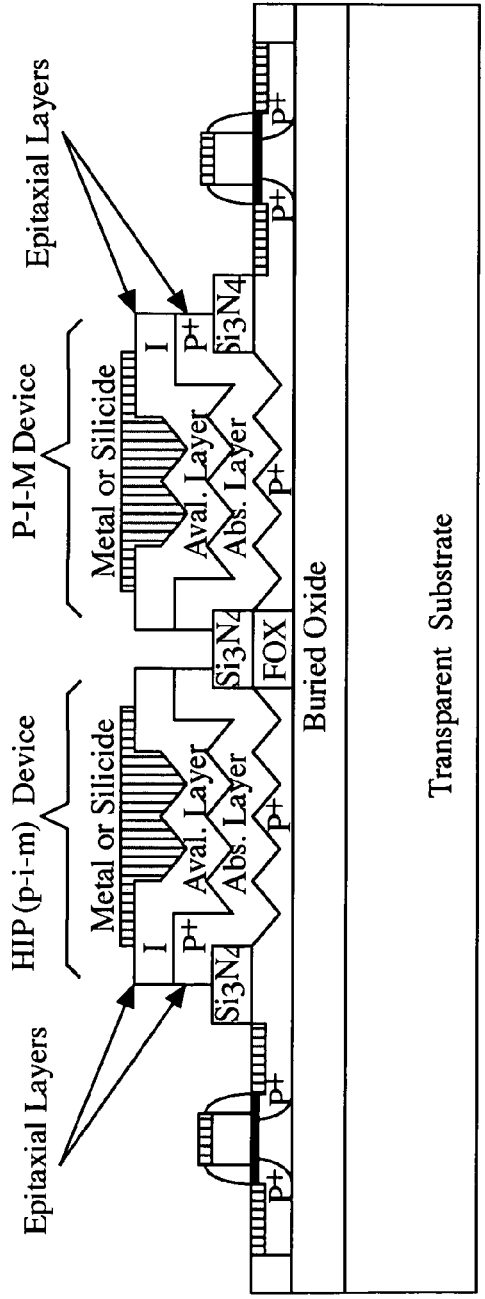
FIG. 3 shows a combination of PIN and HIP devices, side-by-side, monolithically integrated with CMOS devices, with in-situ p-type doping of the initial epitaxial layers, and Schottky junctions as top electrodes. This configuration is meant for Back-Side Illumination.
Figure 4:
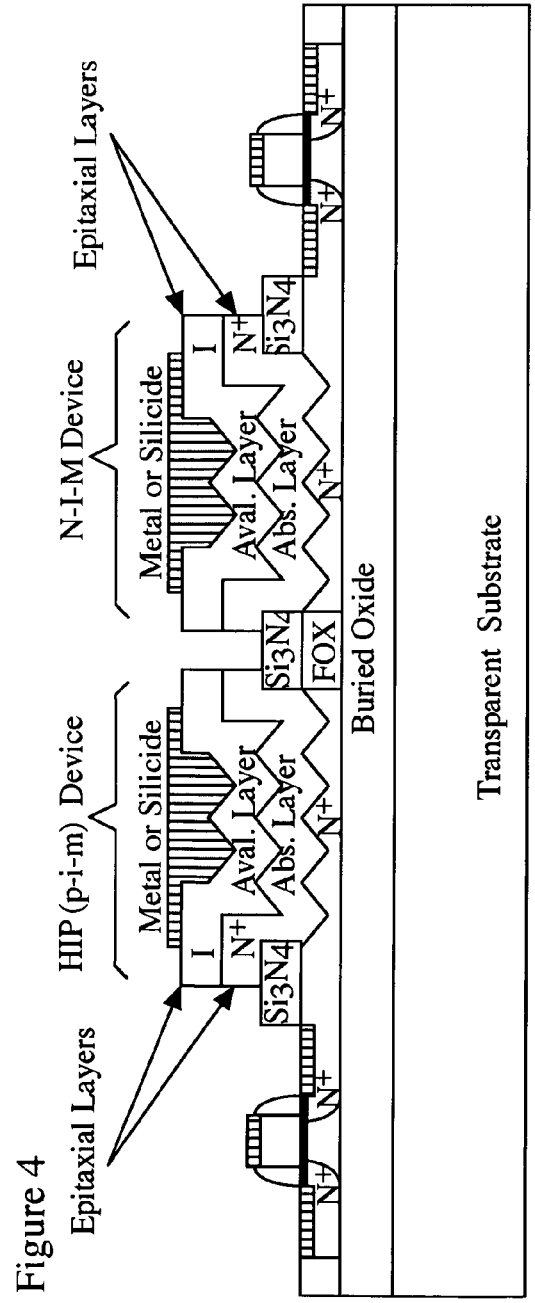
FIG. 4 shows a combination of PIN and HIP devices, side-by-side, monolithically integrated with CMOS devices, with in-situ n-type doping of the initial epitaxial layers, and Schottky junctions as top electrodes. This configuration is meant for Back-Side Illumination.

An alternative approach to combine PIN & HIP devices can also be done with just a single epitaxial deposition step, but having one of the electrodes being formed through a Schottky junction, rather than doping. In this alternative approach, the epitaxial deposition occurs on active-areas with the same type of doping. FIG. 3 shows a combination of PIN and HIP devices, with in-situ p-type doping of the initial epitaxial layers, thus leading to p-i-metal HIP devices. FIG. 4 shows a combination of PIN and HIP devices, with in-situ n-type doping of the initial epitaxial layers, thus leading to n-i-metal HIP devices.

The details of the epitaxial profiles for the PIN and HIP devices and the advantages in implementing them in the fabrication of light-sensing devices will be discussed below. It will be apparent that, with the appropriate choice of substrate materials, device layers and heterojunction engineering and process architecture, it becomes possible to fabricate silicon-based and germanium-based multi-spectral sensors that can deliver pixel density and cost of fabrication comparable to the state of the art CCDs and CMOS image sensors. The present invention can be implemented with epitaxially deposited films on the following substrates: Silicon Bulk, Thick-Film and Thin-Film Silicon-On-Insulator (SOI), Germanium Bulk, Thick-Film and Thin-Film Germanium-On-Insulator (GeOI).

Geometry & Layout of PIN & HIP for Operation in Avalanche & Geiger Modes

Epitaxial growth of photo-diode devices provides photo-detectors that are decoupled from the structural parameters of the CMOS devices, such as doping profiles, junction depths, gate oxide, etc. For this reason, that process architecture allows the photo-detectors to be optimized independently from the CMOS devices. In particular, there are two key aspects that are impossible to implement with standard CMOS image sensors: fabrication of heterojunctions for bandgap engineering and operation in the Avalanche and Geiger modes.

With bandgap engineering it is possible to enhance the coefficient of absorption of the photo-absorbing regions for the visible range, as well as to improve light detection for wavelengths outside the visible range. The Avalanche and Geiger modes of operation require the active region of the PIN photodiodes to be operated under very high electric fields, near and above the breakdown voltage of the active areas respectively.

The PIN & HIP devices fabricated according to the present invention can also be operated under the required bias conditions necessary for the Avalanche and Geiger modes of operation. Each device and device type (PIN & HIP) can be independently biased and can be operated in "normal bias", Avalanche and Geiger modes.

Epitaxial growth as disclosed in WO 02/033755 produces "vertical devices", in which current flows perpendicularly to the epitaxial layers. The deposited layers are flat and fully cover each active area. In order to maximize the functional advantages of operating the PIN & HIP devices in Avalanche & Geiger modes, it is necessary to pay special attention to layout-related aspects of the devices. In particular, it is necessary to avoid spurious currents from being amplified by the Avalanche/Geiger effects. Therefore, in devices fabricated according to that process flow it is necessary to avoid/suppress as much as possible all leakage currents originated at the edges between the active layers and the lateral isolation used in advanced CMOS technology: Shallow Trench Isolation (STI).

FIG. 5 to 8 show three different geometries with which it is possible to implement the same device (PIN or HIP). These geometries provide examples of alternative strategies to minimize the probability of charges originated by the thermal generation/recombination processes being multiplied by the avalanche process. Those charges are generated at the interface between the active areas and the isolation regions, which typically consist of trenches filled with silicon-oxide.

Figure 5:
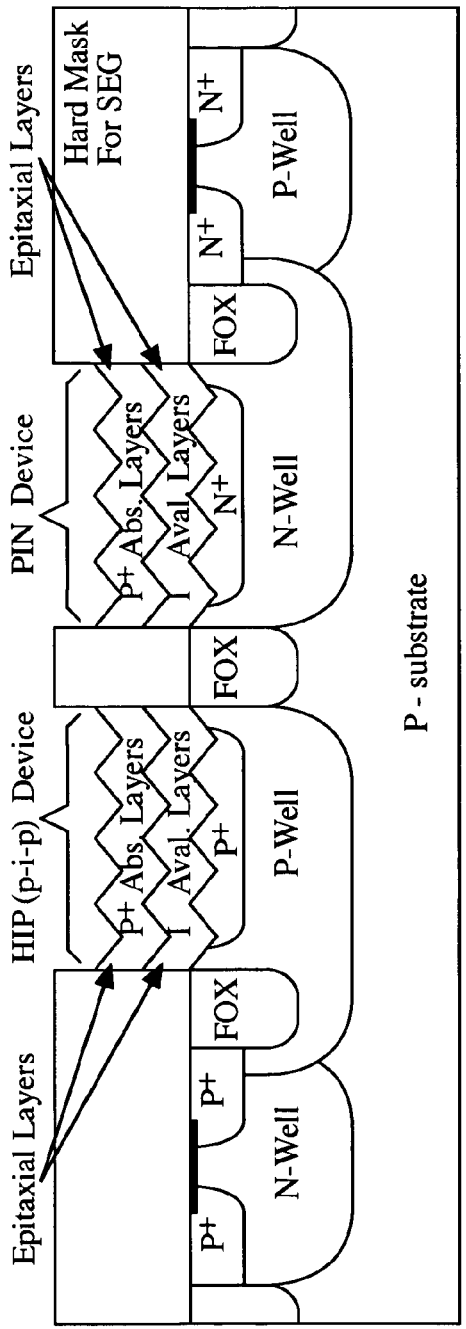
FIGS. 5 to 8 show four different geometries with which it is possible to implement the same device (PIN or HIP).
Figure 6:
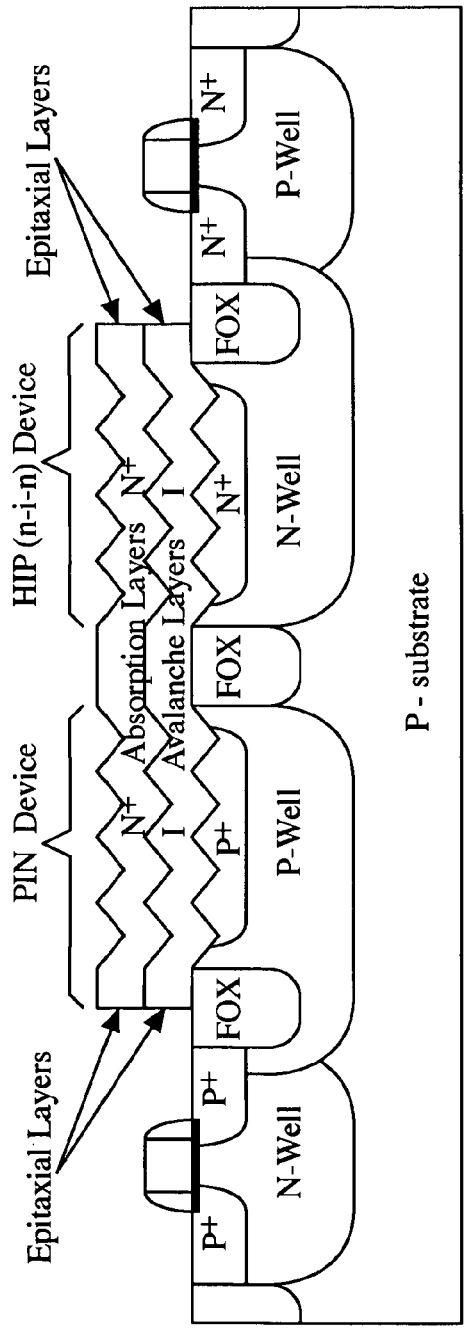

In particular, FIG. 5 shows device layers as grown by selective epitaxial growth (SEG) on a silicon bulk substrate. In this case the photodiode active areas are non-uniformly doped so that the electric field at the edges of the active areas is much weaker than at the center. FIG. 6 shows similar strategy for device layers which are epitaxially deposited in a non-selective way. The non-selective epitaxial growth of the layers in which the avalanche process takes place over a non-uniformly doped surface has one important advantage: the layers in which avalanching takes place are not surrounded by the isolation trenches, and therefore the generation/recombination originated by the surface states is completely removed from the high electric field regions, where avalanching takes place.

On the other hand, the epitaxially deposited layers are amorphous and/or poly-crystalline over the silicon-oxide and/or silicon-nitride areas. For this reason, there is a boundary between the single-crystal film deposited over the active region and the amorphous/poly film deposited over the isolation area. This boundary and the amorphous and/or poly crystalline films have many structural defects that act as centers of generation/recombination. However, it is still expected that this geometry/layout is better at suppressing noise generated by edge-related defects than the one depicted in FIG. 5.

Figure 7:
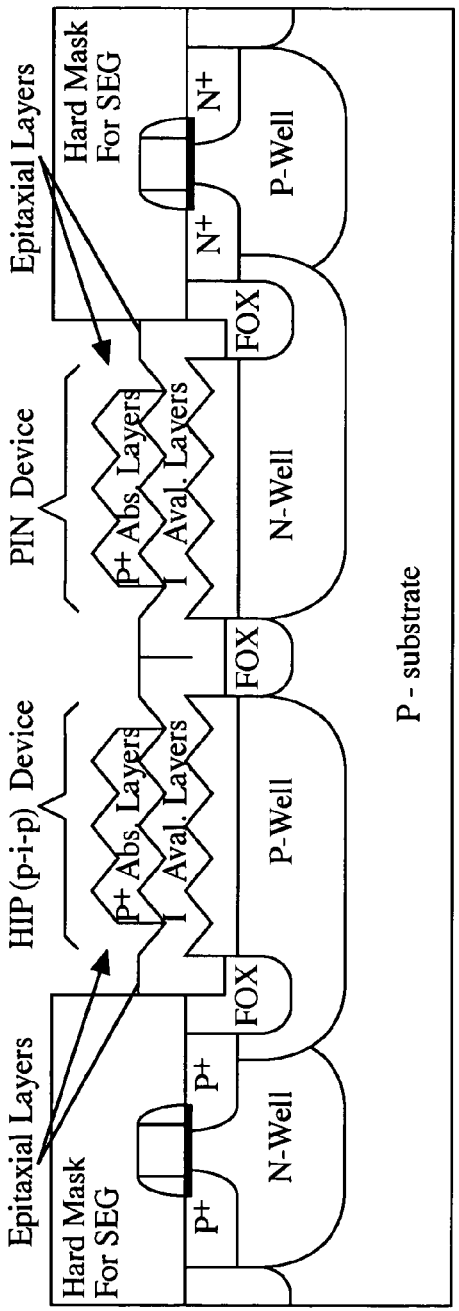
Figure 8:
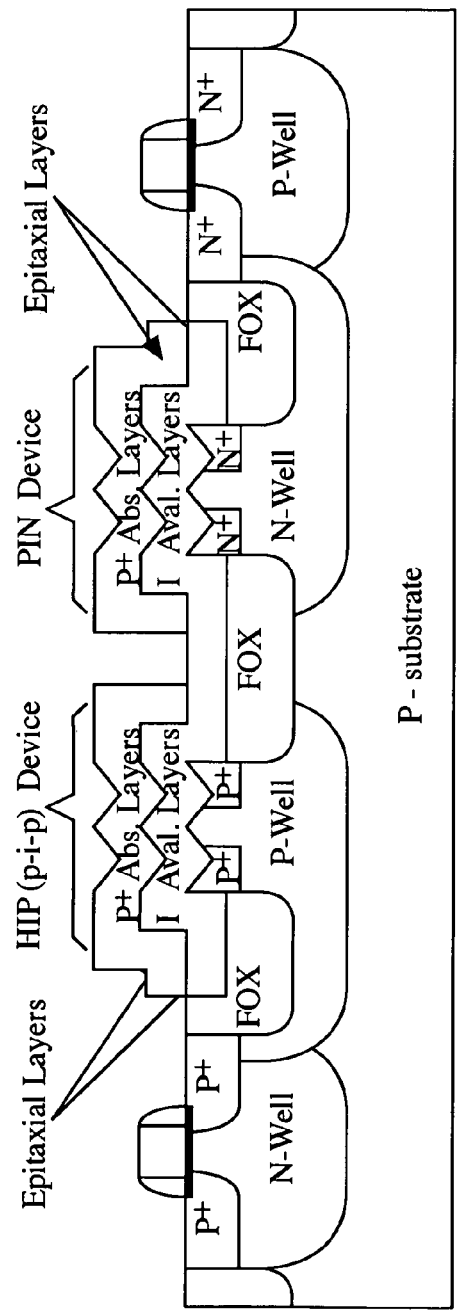

FIGS. 7 and 8 show alternative geometries where the active area onto which the epitaxial films are deposited is not a simple planar surface. The lateral edges of the active area can be exposed in a very straightforward manner, and without extra process complexity, or cost. This geometry can be easily achieved by prolonging or tuning the pre-epitaxial cleaning process so that it results in an over-etch of the silicon oxide providing isolation between active areas. This geometry solves the problem of edge defects supplying spurious carriers to the avalanching regions, can be achieved with selective and non-selective epitaxial depositions, and in both cases the epitaxial films grown on the edges of the active region are single-crystal. The full encapsulation of the bottom electrode (n+ or p+ active regions) results in the complete suppression of leakage currents along the lateral edges of the active regions and epitaxial active layers. Simulations and experimental results will determine how deep the recess of the field oxide needs to be in order to suppress leakage currents. The geometry of the electric field between the top electrode and the bottom electrode is dependent on the layout of two steps: the doping of the bottom electrode. i.e., surface of the active area, and the patterning of the top electrode.

In the particular combination of geometry and layout shown in FIG. 7, the doping of the bottom electrode (surface of active area) is uniformly doped, and the patterning of the top electrode is recessed with respect to the edges of the active area. It should be noticed that the non-doped film in which avalanching takes place is not recessed and therefore fully covers the edges of the bottom electrode. With this combination of structural geometry and layout, the electric field between the top and bottom electrodes is much weaker at the edges than it is at the center of the structure. Because of the uniform doping of the bottom and top electrodes, the electric field should be constant in most of the cross section of the device, becoming weaker only near the edges. This geometry of the electric field insures that the threshold for avalanching is never reached at the edges of the active area, while there is uniform avalanching everywhere else.

In the combination of geometry and layout shown in FIG. 8, the bottom electrode is non-uniformly doped, both in the horizontal direction, with higher doping concentration at the edges than at the center of the active area, and in the vertical direction, with a recessed profile, meaning high doping concentration at the top surface, and decreasing doping concentration when moving away from that surface. This particular combination of geometry and layout results in an electric field that is strongest at the corners of the active region, with rapid weakening when moving away from those corners.

The configuration shown in FIG. 8 still prevents edge defects to inject carriers into the avalanching region, but allows a "corner effect" that for the a given applied voltage results in an electric field that is much larger than for a "planar interface" between the top and bottom electrodes, such as those shown in FIGS. 5, 6 and 7. The stronger electric field originated by the "corner effect", provides the possibility of impact ionization and therefore avalanche processes at voltages significantly lower than those necessary for "planar interfaces", that is, without the "corner effect". It should be realized that this is essentially a geometry effect, and that the breakdown of the junction will happen at lower voltages, still through impact ionization, rather than with band-to-band tunneling. The non-uniform doping of the bottom electrode helps to concentrate the electric field at the corners of the active areas. The electron-hole pairs generated at the center of the top electrode, which also acts as the absorbing layer, feel a drift electric field towards the corners of the active region where they are accelerated and promote impact ionization, i.e., avalanche multiplication.

It is worth noting that FIGS. 3 and 4 already show epitaxial layers which have geometries conducive to the "corner effect". These corners are a natural consequence of a process flow in which the epitaxy is performed inside a window of a dielectric such as $Si_3N_4$, which is necessary to provide an etch stop for the patterning of the epitaxial layers. Furthermore, the layout of the mask used to pattern the epitaxial window may be such that the number of corners thus generated can be either maximized or minimized.

The geometries and layouts shown in FIGS. 5 to 8 can be implemented for PIN devices alone, HIP devices alone, or combined PIN and HIP devices.

Optimal Profiles of Avalanche Regions

The avalanche region is the "middle region", between the top and bottom electrodes, of both PIN devices and HIP devices. Either the top or the bottom electrode will also be the absorption layer for both the PIN and the HIP devices.

Because the avalanche region is also grown epitaxially, it is possible to perform bandgap and doping engineering in order to optimize the performance of the avalanche process. Photo-generated carriers will be injected from the absorption layer, and therefore the avalanche profiles can be oriented according to the position of the absorption layer.

The avalanche process should increase the signal-to-noise ratio (SNR) of the photo-absorbed signal. Therefore, the amplification of the incoming signal should be as large as possible, while the noise associated with the amplification process should be as low as possible. At the same time, from circuit integration and power dissipation standpoints, high amplification or multiplication factors should be obtained with the smallest voltage possible.

These requirements can be met with the "staircase" profiles described by F. Capasso et al. (IEEE Trans. Elec. Dev., Vol. 30, No. 4, pp. 381-390, 1983), which effectively lead to single-carrier or unipolar avalanche processes, thereby resulting in minimal "excess noise". The judicious insertion of narrow bandgap regions with a "Type-I" band alignment, in a "host" wider bandgap material, enables the blocking of the transport of one type of carriers. At the same time, when crossing the heterojunction interfaces with discontinuities in the potential energy, the other type of carrier gains additional kinetic energy in virtue of the conversion of excess potential energy into kinetic energy.

For one-sided junctions the minimum voltage required for causing impact ionization is about 6.6 times the magnitude of the bandgap. Therefore, by positioning the narrow bandgap regions at points in which there is a high probability of impact ionization, the voltage necessary to cause avalanching is lowered with respect to the substrate material.

Because smaller bandgap materials have higher intrinsic carrier concentration, and thus higher thermal noise, it is more advantageous to minimize the size of the small bandgap regions. For that reason, the avalanche regions consist of alternating wide bandgap layers, in which carriers are accelerated, and small bandgap layers, in which accelerated carriers impact ionize.

For electron-only avalanching, the valence-band edge must have discontinuities that impede the drift-diffusion current of holes. For this purpose, the valence-band edge discontinuities need to present a potential barrier that is high enough so that the only possible current mechanism for holes is thermionic emission of over the heterojunction barrier, and there is a complete suppression of hole current by drift-diffusion mechanisms. At the same time, when crossing the heterojunction interfaces with discontinuities in the potential energy, electrons gain additional kinetic energy in virtue of the conversion of excess potential energy into kinetic energy.

For holes-only avalanching, the conduction-band edge must have discontinuities that impede the drift-diffusion current of electrons. For this purpose, the conduction-band edge discontinuities need to present a potential barrier that is high enough so that the only possible current mechanism for electrons is thermionic emission of over the heterojunction barrier, and there is a complete suppression of electron current by drift-diffusion mechanisms. At the same time, when crossing the heterojunction interfaces with discontinuities in the potential energy, holes gain additional kinetic energy in virtue of the conversion of excess potential energy into kinetic energy.

It should be emphasized that the design and fabrication of the avalanche multiplication layers are independent of the physical mechanisms employed for photo-absorption. For that reason the avalanche layers described below can be used with both PIN and HIP devices described in this application.

The bandgap engineering of the avalanche layers leads to an asymmetry with respect to the point of injection of the photo-generated carriers. As it will be explained later, the avalanche region can operate equally well for electrons or holes, depending only on the direction of the electric field. If the point of injection of the carriers does not change, but the carrier type does, then the only change necessary is to reverse the polarity and adjust the magnitude of the electric field.

Avalanche Regions on Silicon Substrates

The implementation of "staircase" heterojunction profiles for the avalanche regions, is fairly easy to achieve with on Si <100> and Si <111> substrates, with SiGeC random alloys and/or $Si_m$—$Ge_n$ superlattices, and/or $(Si_{1-y}C_y)_m$—$Ge_n$ superlattices, and/or $(Si_{1-y}C_y)_m$—$(Ge_{1-x}C_x)_n$ superlattices strained to silicon.

The incorporation of SiGe and SiGeC random alloys and/or superlattices in the impact-ionization regions has another important consequence: it increases the impact-ionization rate of holes, which depending of the Ge content can even surpass that of electrons. This characteristic is detrimental for low noise operation of avalanche processes in uniform regions. However, for avalanche regions with "staircase" heterojunction profiles this characteristic does not impact the noise behavior, and enables hole-only avalanche regions with the same, or even higher, efficiency than electron-only avalanches.

Consequently, by careful design of the avalanche region it is possible to arrive at a profile that provides the same avalanche efficiency, onset of avalanche, gain, and noise behavior, for electron-only avalanching or for hole-only avalanching. In that case, by applying the same voltage amplitude, of the suitable polarity, to devices injecting electrons and holes, would result in the same avalanche multiplication factor, and the same "excess noise" factor for both carrier types. Then the parameters of the avalanche region become a neutral factor in the choice of the doping type for the absorption layer.

The same kinds of alloys and superlattices mentioned for normal, "unstrained", silicon substrates can also be used with "strained silicon substrates", or on SiGe relaxed buffer layers. Naturally these possibilities also apply to Silicon-On-Insulator (SOI) and Strained-Silicon-On-Insulator (SSOI) <100> and <111> substrates.

Figure 10:
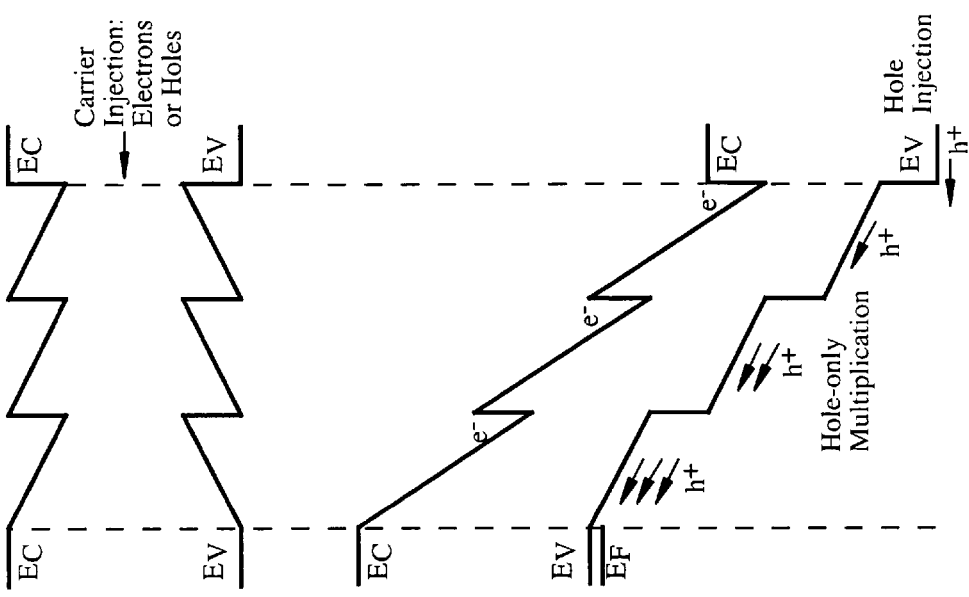
FIGS. 9 and 10 show schematic representations of the ideal energy-band diagram of avalanche layers that under a certain bias provide electron-only avalanche multiplication, and under the reverse polarity bias provide hole-only avalanche multiplication, as long as both types of carriers are injected from the same direction into the avalanche layers.
Figure 9:
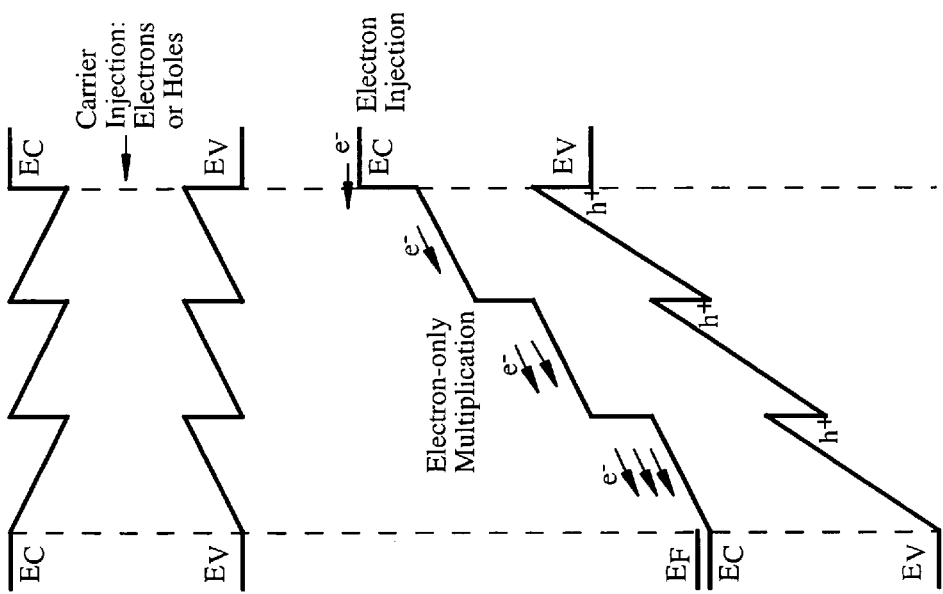

FIGS. 9 and 10 show schematic representations of the ideal energy-band diagram of avalanche layers that under a certain bias provide electron-only avalanche multiplication, and under the reverse polarity bias provide hole-only avalanche multiplication, as long as both types of carriers are injected from the same direction into the avalanche layers.

Figure 11:
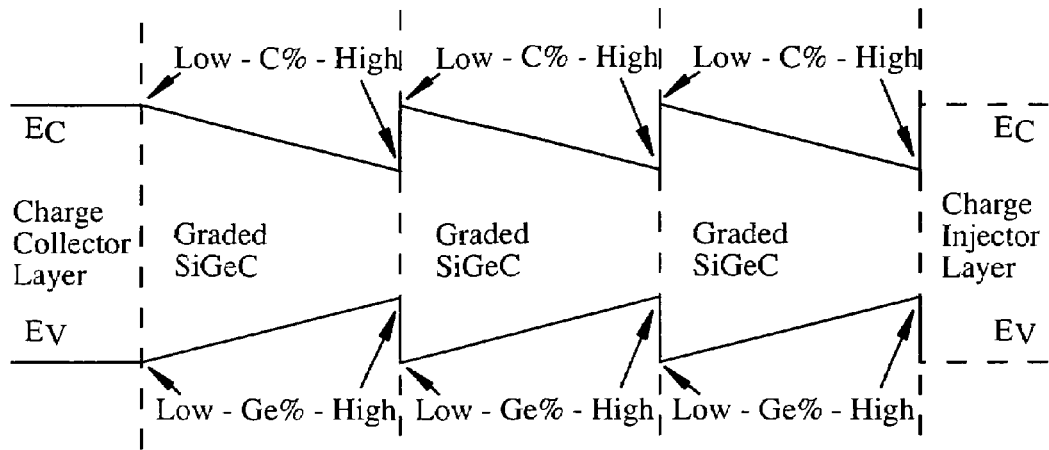
FIGS. 11 and 12 show schematic representations of avalanche layers and associated energy-band diagrams, implemented with SiGeC random alloys, or $(Si_{1-y}C_y)_m$—$(Ge_{1-x}C_x)_n$ short-period strained-layer superlattices on Si substrates.
Figure 12:
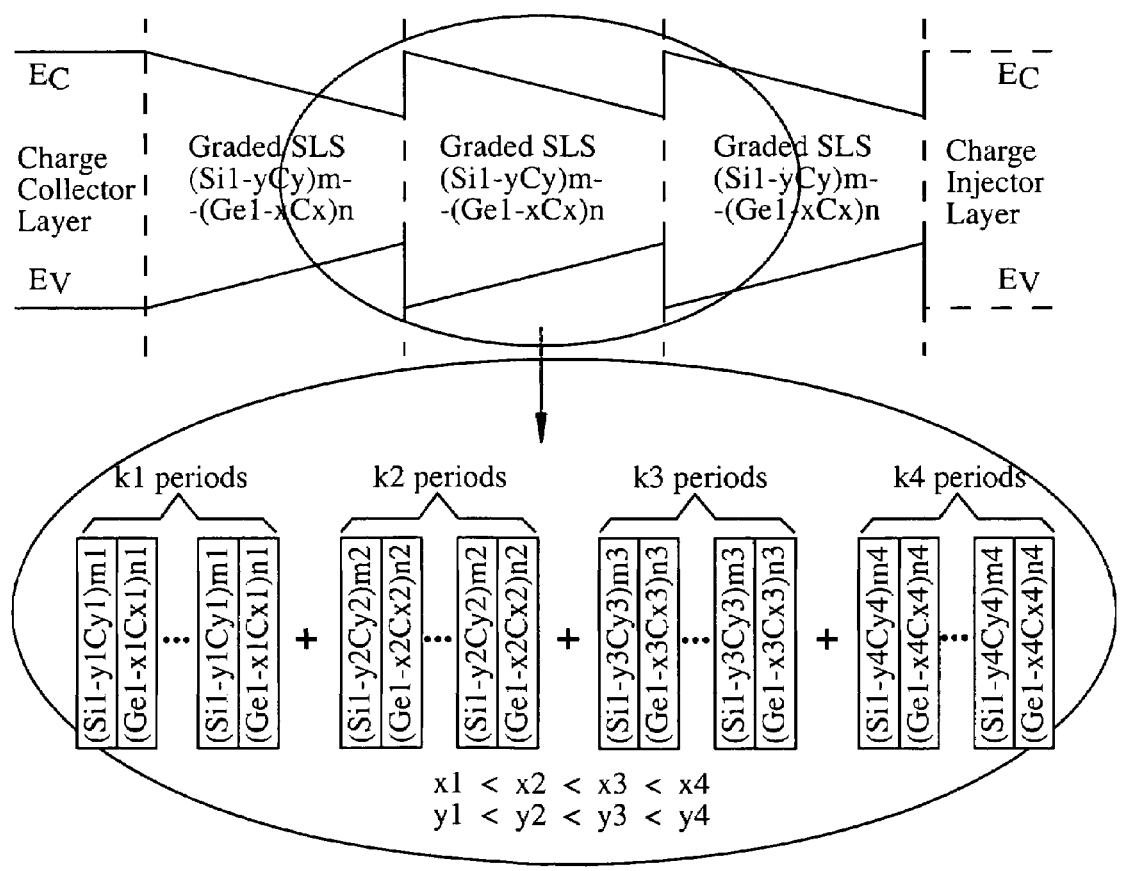

FIGS. 11 and 12 show schematic representations of avalanche layers and associated energy-band diagrams, implemented with SiGeC random alloys, or $(Si_{1-y}C_y)_m$—$(Ge_{1-x}C_x)_n$ short-period strained-layer superlattices on Si substrates.

Avalanche Regions on Germanium Substrates

The implementation of "staircase" heterojunction profiles for the avalanche regions is also fairly easy to achieve with on Ge <100> and Ge <111> substrates. Using SiGe and SnGe alloys and superlattices, it is possible to construct conduction-band and valence-band offsets. It is also engineer strain compensation, since Ge is smaller than Sn but bigger than Si. This is an analogous situation to silicon substrates in which Carbon, being smaller than Si, can be used to compensate the strain of Ge which is bigger than Si.

Because the band alignments of these alloys and superlattices, strained to Ge substrates are not quantitatively well known, the schematic energy-band diagrams shown in FIGS. 9 and 10 depict desirable qualitative alignments.

Once the accurate data about these alignments becomes publicly available, it will be possible to make quantitative energy-band diagrams similar to those shown for the SiGeC random alloys and superlattices on silicon substrates.

Optimal Profiles for Absorption Region of Avalanche PIN Devices

Separate Absorption and Multiplication Avalanche Photo-Diodes (SAM-APDs) are asymmetric PIN diodes. The "I" region is the avalanche region, and was described above. The absorption region, which is also an electrode, is substantially more complex than the other electrode.

The surface at which light penetrates the SAM-APD, is the side where the absorption layer needs to be. This asymmetry is very important because it defines the proper layer sequence for the avalanche region and for the absorption region. For the absorption region this asymmetry is important because it defines the orientation of the built-in drift field that drives carriers into the avalanche region, which must have its band offsets oriented accordingly.

Ideally the absorption layer, which is simultaneously an electrode, has the following properties: high coefficient of absorption for all the wavelengths of interest, built-in drift field for driving photo-generated carriers into the avalanche region, and low electrical resistance.

On one hand the absorption region should be a thin-film so that there is a minimal distance for the photo-generated carriers to travel through, before reaching the avalanching region. On the other hand, the photo-absorption should be as complete as possible, for which thicker photo-absorption films are better. In any case the absorption should be as high as possible because it generates a stronger signal before avalanche amplification, and because it avoids photo-generation in other layers of the device, which in turn avoids the injection of two types of carriers into the avalanche region.

The avalanche layer, its requirements and its design are described earlier herein. The essential requirement for the "other" electrode layer is to be highly conductive.

Absorption Region of PIN Devices on Silicon Substrates

As mentioned above, this region should be a highly efficient light absorber, have a drift field for the photo-generated carriers, and have low resistance. It is well known that Germanium has much higher coefficients of absorption photo-absorber than Silicon, because of its 0.66 eV (versus 1.12 eV in Si) minimum bandgap, and because its smallest direct bandgap is 0.8 eV (versus 3.4 eV in Si).

It is also known that $Si_{1-x}Ge_x$ and/or $Si_{1-x-y}Ge_xC_y$ random alloys strained to silicon <100> substrates retain the essential features of the band structure of silicon, that is, the bandgap is reduced with increased germanium content mainly because of a shift in valence band edge. Similarly to silicon, the direct bandgaps of SiGe are much larger than the minimum indirect bandgap. However the alloys show appreciable improvements in the coefficients of absorption for the visible range and extend the wavelength of detection deeper into the SWIR range. There seems to be a fairly linear relation between the improvement in coefficient of absorption and the amount of Ge in the films.

Strained-layer superlattices (SLS) consisting of alternating four monolayers of pure Ge and four monolayers of Si, all strained to silicon <100> substrates, have been experimentally verified to have very enhanced optoelectronic properties. It is seen that the experimental conditions under which the "Electroreflectance" is measured, namely the externally applied electric field, these superlattices seemed to have a direct bandgap with a magnitude similar to the direct bandgap of pure Ge, that is around 0.76 eV, which is even less than the energy of photons with the wavelength of 1.55 μm (Energy=0.8 eV).

For <100> silicon substrates it seems that 4 is the maximum number of Ge monolayers possible to grow pseudomorphically without relaxation. On <111> silicon substrates it seems that n=5 or larger should be possible. In any case, 4 monolayers of pure Ge on <100> Si substrates is technologically very difficult to achieve. On the other hand, the larger the number of monolayers the less sensitive the band structure of the superlattice will be to monolayer fluctuation inherent to the epitaxial deposition process.

Theoretical calculations of the band structure of short-period strained-layer $Ge_n$—$Si_m$ superlattices on <100> or <111> Si substrates show that the smallest bandgap is always indirect, regardless of the values for "n" and "m". In these superlattices the conduction-band edge is formed by bulk-Si $\Delta$ states, while the top of the valence-band originates in the bulk-Ge $\Gamma$-point states. The zone-folding of the Silicon conduction-band results in a direct bandgap material only if the 2-fold $\Delta_\perp$ minima are lower in energy than the 4-fold $\Delta_\parallel$ ones. This effect can be achieved in two ways:

1. The 4-fold $\Delta_\parallel$ minima move up by putting silicon under tensile strain. That can be done with the epitaxial growth of silicon films on Ge substrates or SiGe relaxed buffers.
2. The 2-fold $\Delta_\perp$ minima move down by putting silicon under compressive strain. That can be done with the epitaxial growth of silicon doped with carbon atoms, forming $Si_{1-y}C_y$ random alloys.

Growing epitaxial silicon on Ge substrates or SiGe relaxed buffer layers is not suitable for integration with CMOS, unless the CMOS devices are themselves made on strained silicon substrates. On the other hand, it is well documented, the incorporation of Carbon atoms in silicon films induced the lowering of the 2-fold $\Delta_\perp$ minima with respect to the 4-fold $\Delta_\parallel$ minima. This is precisely what is necessary for the zone-folding of the silicon conduction-band to result in a pseudo-direct bandgap.

Fully pseudomorphic $Ge_{1-y}C_y$ random alloys on Si <100> substrates have been experimentally demonstrated by M. Todd et al. (Appl. Phys. Lett. 68, No. 17, 22 April 2407 1996, pp. 2407-2409). Even though the band alignments with respect to silicon are not characterized as a function of Carbon content, it is reasonable to expect that for fairly small amounts of carbon, the band structure will be that of pure Ge strained to silicon, with lowering of the conduction-band, similarly to $Si_{1-y}C_y$ random alloys. The most important advantage of using $Ge_{1-x}C_x$ random alloys strained to <100> Si, instead of pure Ge strained to <100> Si, is that rather than being limited to a maximum of four monloayers, much thicker films can be grown due to the strain compensation provided by Carbon. In turn, this enables the fabrication of $Si_m$—$(Ge_{1-x}C_x)_n$ or $(Si_{1-y}C_y)_m$—$(Ge_{1-x}C_x)_n$ superlattices with much larger periods, i.e., with "m" and "n" much larger than 4 or 5, which has beneficial consequences for the bandgap engineering.

It is hereby disclosed a new strained-layer superlattice on <100> silicon substrates, that from a theoretical standpoint should induce the zone-folding of the conduction-band of silicon into a pseudo-direct bandgap material. The new superlattice is: $(Si_{1-y}C_y)_m$—$(Ge_{1-x}C_x)_n$, that is, "m" monolayers of $Si_{1-y}C_y$ random alloy and "n" monolayers of $Ge_{1-x}C_x$ random alloy, all strained to silicon <100> or <111> substrates.

The magnitude of the lowering of the 2-fold $\Delta_\perp$ minima, with respect to the 4-fold $\Delta_\parallel$ minima, depends on the percentage of carbon present in the alloy. Therefore, it is possible to do extra bandgap engineering by playing with the carbon composition across the total thickness of the superlattice. One possible way to do this, is to have several superlattices, each with consisting of a number of periods of $(Si_{1-y}C_y)_m$—$(Ge_{1-x}C_x)_n$, and each having a different percentage of Carbon atoms in the $(Si_{1-y}C_y)$ random alloy. This way, it is possible to engineer abrupt heterojunctions or smooth variations of the conduction-band edge across the entire superlattice, and thus create a built-in electric drift field across the entire superlattice.

One more, and very important, benefit of the incorporation of carbon in the superlattice is the compensation (at least partial) of the strain induced by the presence of the 4 monolayers of pure Ge. The amount of strain compensation depends on the amount of Carbon in the films. Strain compensation can be used to increase the total thickness (number of periods) of the superlattice, far beyond what is the critical thickness for the superlattice without Carbon atoms.

The ideal absorption layer of a SAM-APD on Silicon <100> substrates is thus composed of multiple $(Si_{1-y}C_y)_m$—$(Ge_{1-x}C_x)_n$, periods, each with its own carbon concentration in order to have a built-in field that drives the photo-generated carriers into the avalanche region.

The absorption layers with the heterojunction and doping profiles described in this section can be implemented with any of the geometries and layout features shown in FIGS. 5 to 8.

Figure 14:
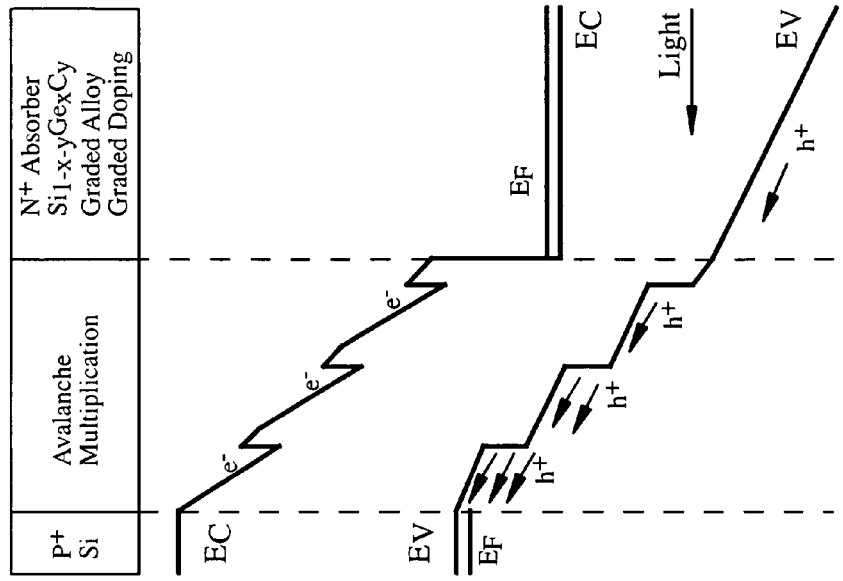
FIGS. 13 and 14 show schematics of the ideal heterojunction and doping profiles, along with a schematics of the corresponding energy-band diagrams, of Avalanche PIN devices for Si substrates using SiGeC random alloys.
Figure 13:
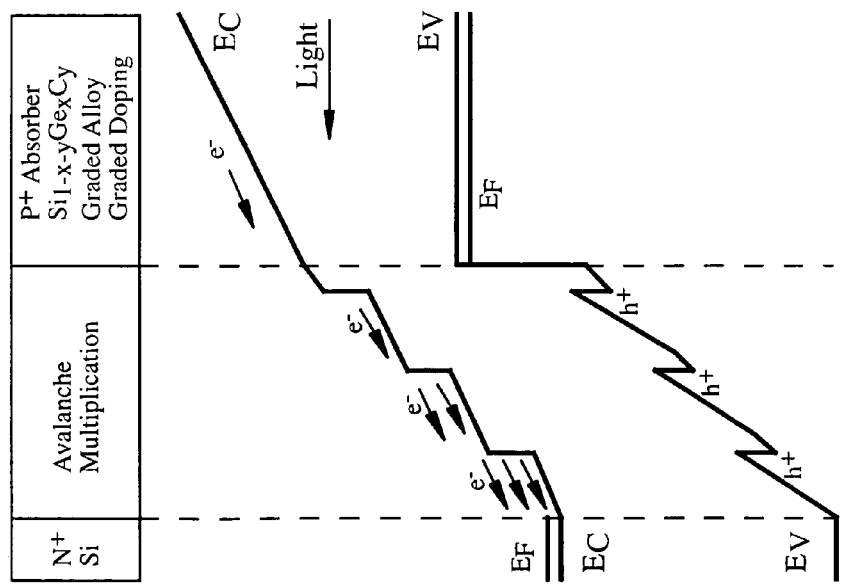

FIGS. 13 and 14 show schematics of the ideal heterojunction and doping profiles, along with schematics of the corresponding energy-band diagrams, of PIN SAM-APDs for Si substrates using SiGeC random alloys. In particular, FIG. 9 depicts a SAM-APD with p-type doped top-electrode/absorption-layer for electron injection and avalanching, and FIG. 10 depicts a SAM-APD with n-type doped top-electrode/absorption-layer for hole injection avalanching.

Figure 16:
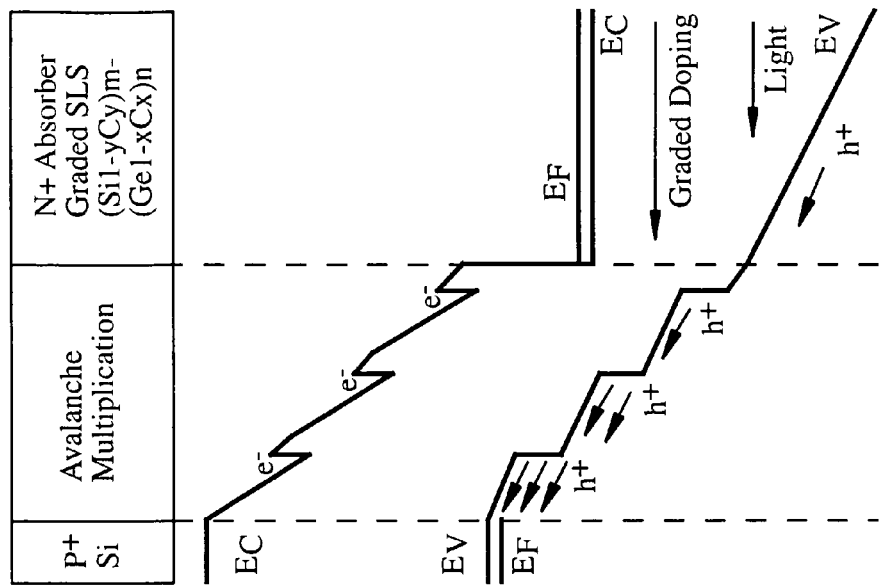
FIGS. 15 and 16 show schematics of the ideal heterojunction and doping profiles, along with a schematics of the corresponding energy-band diagrams, of Avalanche PIN devices for Si substrates using $(Si_{1-y}C_y)_m$—$(Ge_{1-x}C_x)_n$ short-period strained-layer superlattices.
Figure 15:
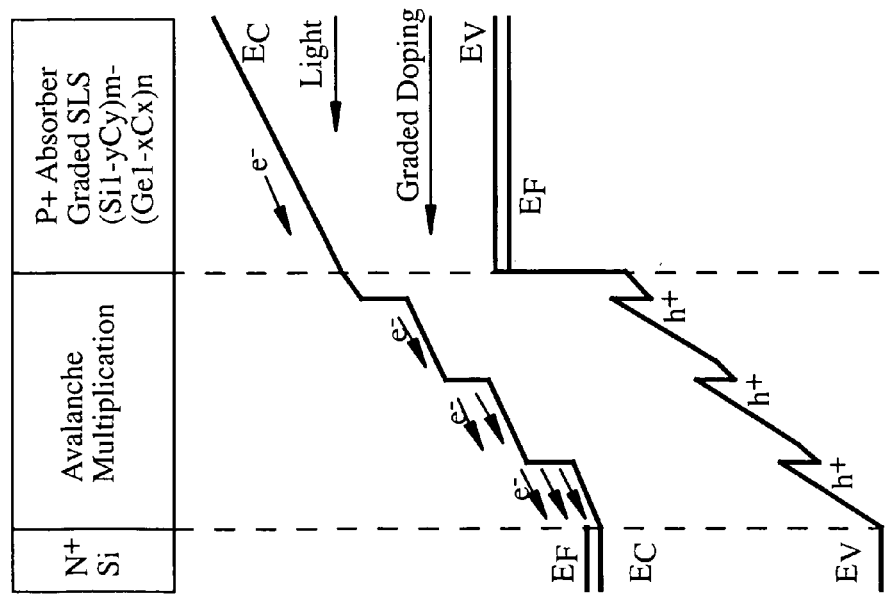

FIGS. 15 and 16 show schematics of the ideal heterojunction and doping profiles, along with schematics of the corresponding energy-band diagrams, of PIN SAM-APDs for Si substrates using $(Si_{1-y}C_y)_m$—$(Si_{1-x-y}Ge_xC_y)_n$ short-period strained-layer superlattices. FIG. 15 depicts a SAM-APD with p-type doped top-electrode/absorption-layer for electron injection and avalanching. FIG. 16 depicts a SAM-APD with n-type doped top-electrode/absorption-layer for hole injection and avalanching.

Absorption Region of PIN Devices on Germanium Substrates

Theoretical calculations show that $Si_mGe_n$ superlattices strained to Ge <100> and <111> substrates can have a pseudo-direct bandgap. Several combinations of "m" and "n" result in pseudo-direct bandgaps with slightly different characteristics. In addition to enabling pseudo-direct bandgaps, SiGe and SiGeC alloys and/or superlattices can be useful to perform bandgap engineering for purposes such as to construct a built-in drift field across the superlattice, and to construct an avalanche region in which only unipolar avalanche processes take place.

Germanium substrates are suitable for other types of Group IV alloys and/or superlattices, such as those including Sn (Tin): GeSn, SiGeSn, SiGeSnC, SiSnC, SnC, strained to the germanium substrate. GeSn random alloys and/or superlattices with the right stoichiometry have direct bandgaps. The epitaxial growth of such alloys has been demonstrated on Ge substrates, with <100> orientation. Given that the conduction-band minima of Ge occur along the <111> directions, and given that the transversal electron mobility in Ge is highest on <111> substrates, these substrates are the preferred ones for electronic (such as MOSFETs) and optoelectronic devices (such as APDs) using band-to-band transitions. The incorporation of Si and C atoms in the GeSn alloys can be used to construct conduction- and/or valence-band edge discontinuities, as well as to provide strain-compensation to the Sn atoms, which are much larger than the Ge atoms.

Because the band alignments of these alloys and superlattices, strained to Ge substrates are not well known, the schematic energy-band diagrams of FIGS. 13 to 16 depict the desirable qualitative alignments. Once the accurate data about these alignments becomes publicly available, it will be possible to make quantitative energy-band diagrams similar to those shown for the SiGeC random alloys and superlattices on silicon substrates.

Device Layer Fabrication for Front-Side Illumination

"Front-Side Illumination" refers to a situation in which light penetrates the light-sensing layers having traveled through the Inter-Metal Dielectric layers. This illumination condition is the most common one, and can be implemented by fabricating the devices on bulk Si or Ge substrates, thick-film SOI, thick-film GeOI, or Thin-Film SOI, or Thin-Film GeOI. With this illumination condition, the top electrode is also the absorption layer.

FIG. 1 shows CMOS devices with the Avalanche PIN photo-diode having a p-type absorption layer and top electrode. This configuration requires the Avalanche PI photo-diode to have a n-type bottom electrode.

FIG. 2 shows CMOS devices with the Avalanche PIN photo-diode having a n-type absorption layer and top electrode. This configuration requires the Avalanche PIN photo-diode to have a p-type bottom electrode.

Device Layer Fabrication for Back-Side Illumination

"Back-Side Illumination" refers to a situation in which light penetrates the light-sensing layers from the side opposite to that having the multi-level metal interconnects. The simplest way to implement this illumination condition is to fabricate the devices on Thin-Film SOI substrates, or Thin-Film GeOI substrates. With these substrates, the bottom electrode is also the absorption layer.

In FIG. 3 there is shown CMOS devices with the Avalanche PIN photo-diode having a p-type absorption layer and bottom electrode, and having a Schottky junction top electrode. FIG. 4 shows CMOS devices with the Avalanche PIN photo-diode having a n-type absorption layer and bottom electrode, and having a Schottky junction top electrode.

The same final arrangement, that is, absorption layer facing "down", can be achieved through a different route, in which the epitaxial deposition of the device layers is performed on a sacrificial substrate. After the epitaxial deposition, the device layers are separated from the sacrificial substrate and then transferred to the final substrate, which is transparent to light. The attachment of the epitaxial device layers to the final substrate is such that the last layers to be grown are the ones at the interface with the final, light-transparent, substrate. Naturally the separation of the device layers from the sacrificial substrate, as well as the attachment to the final substrate, are done at temperatures low enough to avoid changes in the as-grown heterojunction and doping profiles.

Profiles for Absorption Region of Avalanche HIP Devices

Infra-Red (IR) radiation with photon energies smaller than the bandgap of the materials in the PIN photo-diodes, cannot be sensed by the PIN photodiodes. For the range of wavelengths in the 3 µm to 5 µm and 8 µm to 12 µm, sensing can be performed by free-carrier photo-absorption, with the cutoff wavelength being defined by the barrier height of a semiconductor-semiconductor heterojunction (Heterojunction Internal Photoemission—HIP devices), or by the barrier height of a metal-semiconductor heterojunction (Schottky Photo-Diodes).

In the silicon materials system HIP devices can be easily implemented with p-Si/p-$Si_{1-x}Ge_x$ heterojunctions, in which the barrier height is defined by the percentage of germanium in the random alloys and by the p-type doping level and profile across the $Si/Si_{1-x}Ge_x$ heterojunction.

Si/SiGe HIP devices are preferable to Schottky type devices because it is possible to control the SiGe alloy stoichiometry, the doping level and profiles with a high degree of accuracy, and thus fine-tune the barrier height as well as other parameters. Schottky barrier devices can be made only with a limited set of materials, metals and metal-silicides, and therefore it is not possible to continuously vary the photo-absorption and/or transport properties.

State of the Art SiGe/Si HIP photo-detectors are not suitable for room temperature operation. Conceptually the HIP devices can operate at room temperature, but the implementations of the concept with SiGe/Si materials have, thus far, been unsuccessful. There are several physical parameters controlling the efficiency of the SiGe/Si HIP devices that in those implementations compete against each other, and the final performance is not good enough for room temperature operation. In the following, a new implementation of the HIP device concept with SiGeC materials provides a solution to decouple some of the parameters limiting the performance of conventional SiGe/Si HIP devices, thus providing a path for significant improvements in performance that will allow the operating temperature to be increased.

The physical modeling of HIP devices provides the insight about which parameters are control the performance of HIP detectors. In qualitative terms it can be said that the performance of the HIP devices is determined by:

a) Free carrier concentration in the absorbing layer. Typically, the free carrier concentration can be increased by increasing the doping concentration in the absorbing layer.

b) Lifetimes of the carriers in the absorbing layer. The main factor for the decrease of the lifetime has been determined to be the large doping impurity concentration required to provide the free carriers.

c) Free carrier mobility in the plane perpendicular to the epitaxial deposition, which typically is also perpendicular to incident light. Mobility is dependent on the lifetime and on the effective mass of charge carriers. Given that the lifetime is largely determined by the doping concentration, an increase in mobility could be obtained by lowering the hole effective mass, that is, by increasing the concentration of Ge in the absorbing film. However, that leads to an increase of the heterojunction barrier height with respect to silicon, and therefore to a decrease of the cutoff wavelength.

In addition to improvements in the absorption capabilities, through more sophisticated heterojunction and doping profiles, than currently available as State of the Art, the absorption layers are coupled to the avalanche regions described earlier, for high gain and low noise operation. This results in Separated Absorption and Multiplication (SAM) Avalanche HIP devices. The avalanche multiplication could provide the performance increase necessary for these devices to have acceptable operation at room temperature.

Four new device layer profiles are hereby disclosed, that should lead to a considerable improvement in the performance of SiGe-based HIP devices, possibly leading to good enough performance for room temperature operation:

p-type HIP, having heterojunction formed by two different SiGeC random alloys n-type HIP, having heterojunction formed by two different SiGeC random alloy p-type HIP, having heterojunction formed by two different $(Si_{1-y}C_y)_4$—$Ge_4$ superlattices n-type HIP, having heterojunction formed by two different $(Si_{1-y}C_y)_4$—$Ge_4$ superlattices p-Type HIP with SiGeC Random Alloys

In prior art, the heterojunction determining the cutoff wavelength is always between pure silicon and SiGe, hence the name Si/SiGe HIP devices (or SiGe/Si or GeSi/Si, etc.). For a fixed target wavelength of operation, this immediately puts rigid constraints on how much Ge and how much doping needs to be in the absorbing layer.

Figure 17:
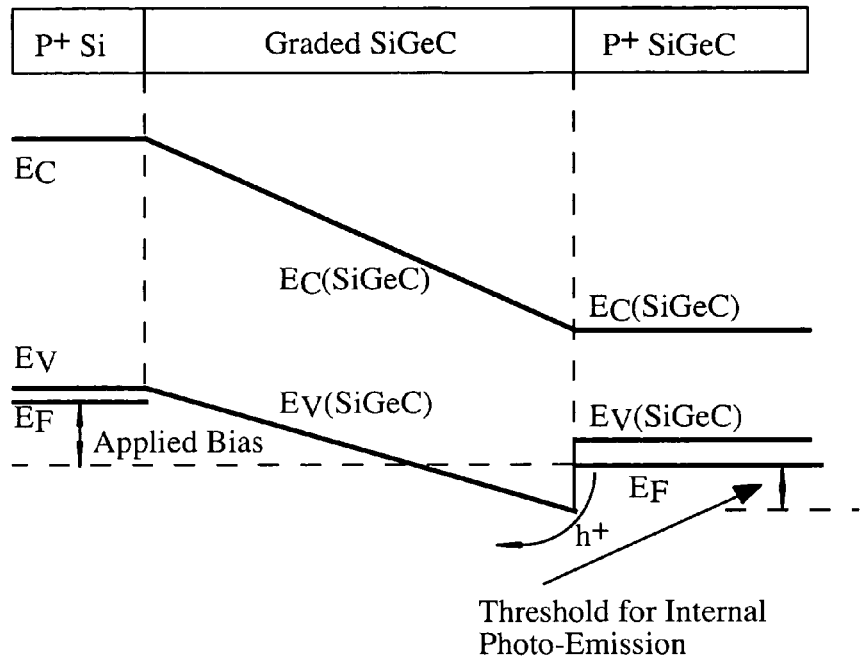
FIG. 17 shows the ideal energy-band diagram, heterojunction and doping profiles of p-type Avalanche HIP devices for Si substrates using $Si_{1-x1-y1}Ge_{x1}C_{y1}/Si_{1-x2-y2}Ge_{x2}C_{y2}$ random alloys.

The key to break the three constraints listed above is to make the heterojunction of the HIP device that controls the cutoff wavelength, with different parameters than what has been done in prior art. It is hereby proposed to make SiGeC/SiGeC p-type HIP devices, in which the band offset controlling the cutoff wavelength is engineered on both sides of the heterojunction. The incorporation of Carbon allows for partial or total strain compensation of the Ge atoms, and thus enables the fabrication of heterojunctions with higher Ge content and/or much thicker films. For a given cutoff wavelength, and thus for a given "barrier height", the incorporation of Ge and C on both sides of the heterojunction provides more flexibility on how to achieve that particular barrier height. For example it allows for higher Ge content and lower doping on the absorption layer, both leading to higher hole mobility and thus to higher detectivity. The new heterojunction design is schematically shown in FIG. 17.

In addition to decreasing the hole effective mass and increasing hole mobility, it is also possible to create complex SiGeC profiles (rather than just a constant film composition) inside the absorbing layer itself, such that some regions can be lowly doped, but that are nonetheless populated with very high free carrier concentration due to effects of "carrier spilling" from adjacent layers at room temperature, effectively achieving a sort of "modulation doping" without creating quantum wells. The expectation is that the free carriers that are "spilled over", enjoy very long lifetimes, and thus further enhancing the mobility.

n-Type HIP with SiGeC Random Alloys

The reason why Si/SiGe HIP devices have been only p-type devices is because SiGe alloys can provide large valence-band discontinuities, and because conventional epitaxial deposition techniques, such as MBE and CVD, have shown very good control in tailoring Boron profiles with in-situ. At the same time, the conduction-band offset obtainable with Si/SiGe heterojunctions strained to <100> silicon is negligible, and sharp n-type doping profiles have been notoriously difficult to achieve with in-situ doping. For these reasons n-type HIP devices on <100> silicon substrates did not seem feasible.

The demonstration of high-quality $Si_{1-y}C_y$ and $Si_{1-x-y}Ge_xC_y$ random alloys made possible the fabrication of conduction-band offsets with increased electron mobility, at least for very moderate amounts of carbon. It has since been verified that carbon, in addition to compensating the strain due to Ge, also suppresses Boron diffusion, and more recently has also been shown to be extremely helpful in achieving sharp doping profiles during in-situ phosphorous doping with Rapid Thermal CVD.

With high quality $Si_{1-y}C_y$ and $Si_{1-x-y}Ge_xC_y$ random alloys, and abrupt n-type doping profiles, n-type silicon-based HIP devices have the potential to be superior to the p-type Si/SiGe HIP devices of prior art. Some of the best results with p-type $Si/Si_{1-x}Ge_x$ HIP devices show that hole mobility values in the range of 28 cm² V-s) to 44 cm²/V-s). These values are much lower than the hole mobility of undoped silicon (450 cm²/V-s), which can be taken as a reference. Assuming that n-type $Si/Si_{1-y}C_y$ HIP devices will have an electron mobility that is also just about 10% of the electron mobility of undoped silicon (1500 cm²/V-s), that is still about 300% better than some of the best results with p-type $Si/Si_{1-x}Ge_x$ HIP devices.

Since the starting point, room temperature electron mobility in undoped silicon (1500 cm²/V-s), and strained $Si_{1-y}C_y$ and $Si_{1-x-y}Ge_xC_y$ random alloys, is much larger than the hole mobility in undoped Si layers (450 cm²/V-s), it is therefore reasonable to expect that n-type $Si/Si_{1-y}C_y$ HIP devices can perform better and at higher temperature than p-type $Si/Si_{1-x}Ge_x$ HIP devices.

There are two main technological solutions to further increase the electron mobility in silicon: One is with $Si/Si_{1-y}C_y$ or $Si/Si_{1-x-y}Ge_xC_y$ layers, which in addition to lowering the conduction band edge (Ec), should also increase the electron mobility due to the lifting of the 6-fold degeneracy of the conduction band, with the consequent reduction in inter-valley phonon scattering.

The other has already been experimentally demonstrated: increase in room temperature electron mobility, by straining silicon on SiGe relaxed buffer layers. For example, for SiGe buffer layer with 20% Ge, the electron mobility of silicon increases by a factor of 1.8. Buffers with higher percentage of Ge provide even larger enhancements of the electron mobility in the silicon layer. Naturally, with higher strain there is a reduction in the critical thickness of the strained (silicon) layer. Ultimately it might be possible to reach or even surpass the room temperature electron mobility of Germanium: 3900 cm²V⁻¹s⁻¹.

Strained Silicon on Insulator (SSOI) seems to be in the roadmap for a number of large semiconductor manufacturers, for the 65 nm CMOS generation and below. Therefore, such type of substrates (SSOI) is likely to become widely available and possibly become the standard substrate for high performance.

The following is a simple calculation of performance ratio between of SiGeC/Si n-type HIP on SSOI substrate at 300K and a conventional SiGe/Si p-type HIP on bulk silicon substrates.

The dark current is given by:

$$J_{dark} = A^{**} T^2 e^{-\Psi/K_B T}$$

Increasing temperature from 77K to 300K increases dark current by:

$$\frac{J_{dark}(300\ K)}{J_{dark}(77\ K)} = \left(\frac{300}{77}\right)^2 e^{\frac{300}{77}} \approx 747$$

The variation in Detectivity is given by:

$$\frac{D^*(300\ K)}{D^*(77\ K)} \propto \frac{Abs(300\ K)}{Abs(77\ K)} \sqrt{\frac{J_{dark}(77\ K)}{J_{dark}(300\ K)}} = \frac{6}{\sqrt{747}} \approx 0.22$$

The effective Richardson constant $A^{**}$ is different for p-type and n-type Schottky junctions on silicon. For <100> silicon:

$$\frac{A_e^{}}{A_h^{}} = \frac{110[A\ cm^{-2}\ K^{-2}]}{30[A\ cm^{-2}\ K^{-2}]} \approx 3.7$$

However, it should be noticed that $A^{**}$ depends on the effective mass of the semiconductor, and on the carrier mean free path. Thus, if rather than pure silicon, one has SiGeC, with a significantly different electron effective mass, and a reduced intervalley scattering due to the lifting in the degeneracy in the conduction band (with consequent increase in mean free path), one is then lead to conclude that the effective Richardson constant can also be engineered for optimal performance.

In conclusion, SiGeC/Si n-type HIP devices on SSOI substrate with 20% Ge, could have a performance (detectivity) at 300K that is about 22% that of SiGe/Si p-type HIP devices working at 77K. Even better performance can be attained with higher electron mobility, which can be accomplished with increased strain in the "strained Si" layer, and/or through the incorporation of carbon. These calculations do not include the improvement in Signal-to-Noise Ratio (SNR) of the avalanche multiplication. Once that is also taken into account, it is reasonable to expect that n-type Avalanche HIP devices, even on unstrained silicon substrates, operating at room temperature, can far outperform conventional p-type Si/SiGe HIP devices operating at 77K.

Figure 18:
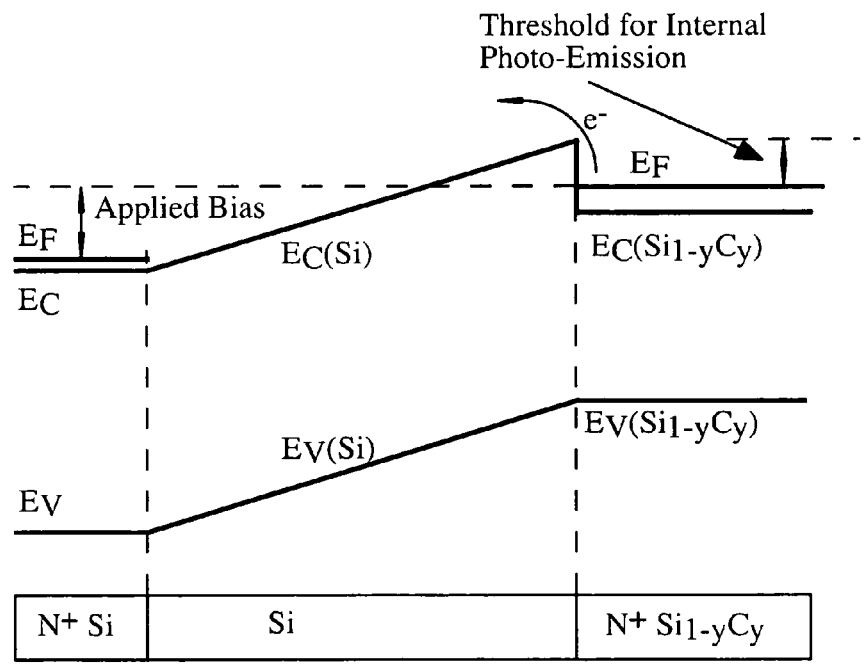
FIG. 18 shows the ideal energy-band diagram, heterojunction and doping profiles of n-type Avalanche HIP devices for Si substrates using $Si/Si_{1-y}C_y$ random alloys.

FIG. 18 shows an exemplary profile and related energy-band diagram for n-type Si/$Si_{1-y}C_y$ HIP devices.

p-Type HIP with SiGeC Superlattices

As stated above, for $(Si_{1-y}C_y)_m$—$(Ge_{1-x}C_x)_n$ superlattices, the conduction-band of the superlattice is mainly derived from the conduction band of the silicon-carbon random alloy, while the valence band of the superlattice is mainly derived from the valence-band of germanium. Accordingly, the fabrication of stacks of superlattices with different carbon contents enables the engineering of the conduction-band edge along the superlattice. Naturally it is possible to have a smooth variation of the valence-band edge, as well as abrupt heterojunctions if pure Ge is replaced with a $Si_{1-x}Ge_x$ (with Ge content larger than 70%) random alloy, resulting in a $(Si_{1-y}C_y)_m$—$(Si_{1-x-y}Ge_xC_y)_n$ superlattice.

Therefore, it is possible to engineer a p-type HIP device on silicon having the valence-band discontinuity formed by $(Si_{1-y}C_y)_m$—$(Si_{1-x-y}Ge_xC_y)_n$ superlattices on both sides of the discontinuity. As mentioned above, for <100> silicon substrates, the maximum number of monolayers of pure Ge before relaxation is four. For silicon <111>, the maximum number of monolayers of pure Ge is above five. On <100> silicon substrates, for $Si_{1-x-y}Ge_xC_y$ rather than pure Ge, the number of monolayers possible without relaxation is certainly above four, depending on the Ge and Carbon concentrations. In Ge bulk substrates, the valence-band is degenerate. In SiGe random alloys and pure Ge strained to Si substrates, the edge of the valence-band is provided by light-hole band alone. Therefore, even though the hole-effective masses do not change much from the pure elements (Si and Ge) to the superlattices, in the superlattices electrical transport is performed by light-holes only. Consequently, there should be an increase in mobility due to the reduction in mass.

Figure 19:
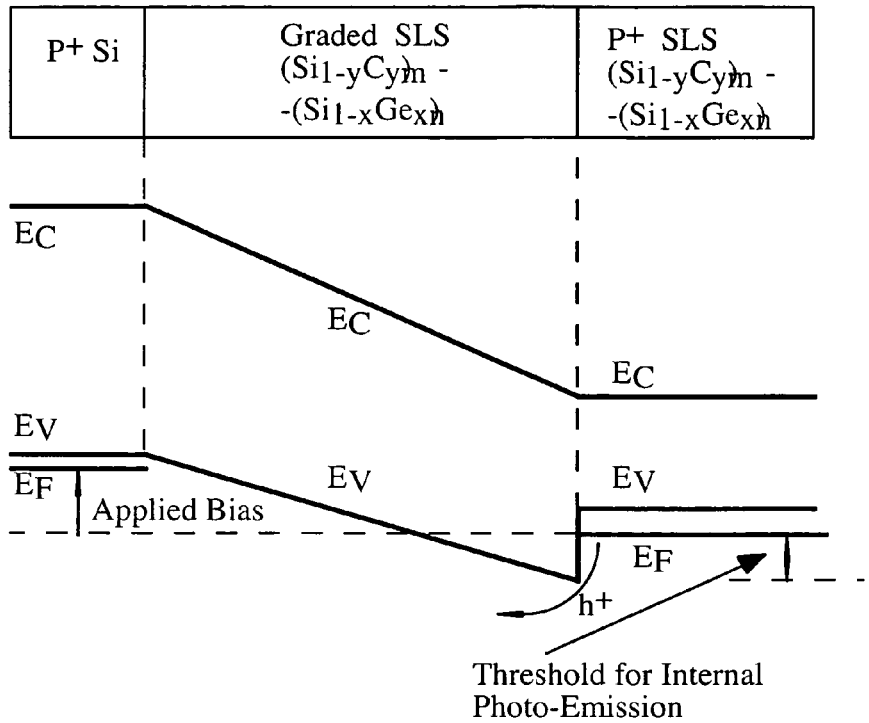
FIG. 19 shows the ideal energy-band diagram, heterojunction and doping profiles of p-type Avalanche HIP devices for Si substrates using $(Si_{1-y}C_y)_m$—$(Ge_{1-x}C_x)_n$ short-period strained-layer superlattices.

FIG. 19 the schematic of the device layers and the corresponding energy-band diagram.

n-Type HIP with SiGeC Superlattices

As stated above, for $(Si_{1-y}C_y)_m$—$(Ge_{1-x}C_x)_n$ superlattices, the conduction-band of the superlattice is mainly derived from the conduction band of the silicon-carbon random alloy, while the valence band of the superlattice is mainly derived from the valence-band of germanium. Accordingly, the fabrication of stacks of superlattices with different carbon contents enables the engineering of the conduction-band edge along the superlattice. Naturally it is possible to have a smooth variation of the valence-band edge, as well as abrupt heterojunctions if pure Ge is replaced with a $Si_{1-x}Ge_x$ (with Ge content larger than 70%) random alloy, resulting in a $(Si_{1-y}C_y)_m$—$(Si_{1-x-y}Ge_xC_y)_n$ superlattice.

Therefore, it is possible to engineer a n-type HIP device on silicon <100> and <111> substrates having the conduction-band discontinuity formed by $(Si_{1-y}C_y)_m$—$(Ge_{1-x}C_x)_n$ superlattices on both sides of the discontinuity. The conduction-band discontinuity between superlattices will be determined by the amount of Carbon present in each of the superlattices.

Figure 20:
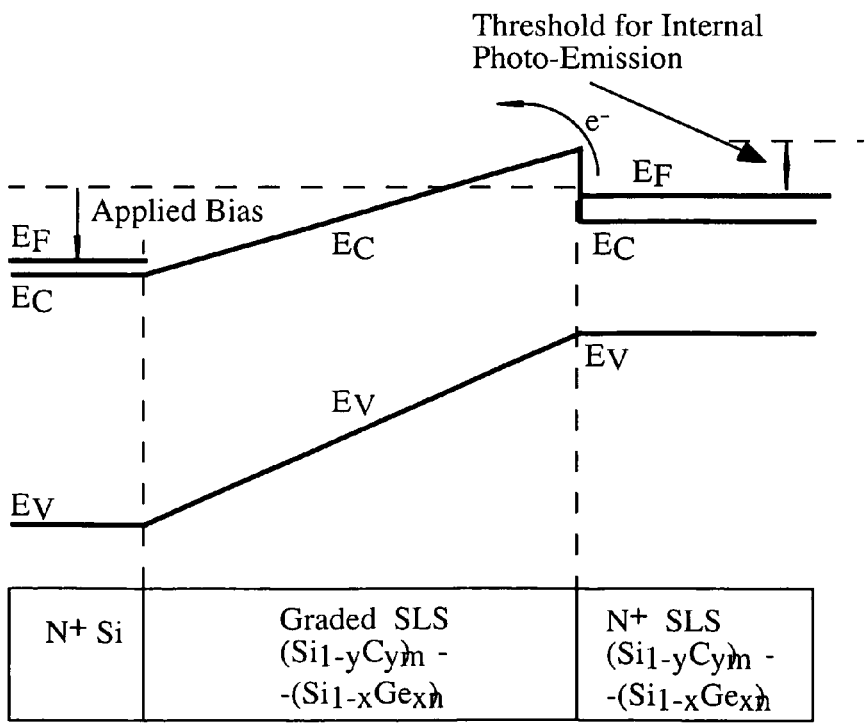
FIG. 20 shows the ideal energy-band diagram, heterojunction and doping profiles of n-type Avalanche HIP devices for Si substrates using $(Si_{1-y}C_y)_m$—$(Ge_{1-x}C_x)_n$ short-period strained-layer superlattices.

Theoretical calculations for $Si_m$—$Ge_n$ superlattice grown on silicon substrates show that the electron effective mass in the superlattice is very similar to the silicon bulk values. It is then reasonable to assume that for $(Si_{1-y}C_y)_m$—$(Ge_{1-x}C_x)_n$ superlattices the electron effective mass in the superlattice will be very similar to the electron effective mass in $Si_{1-y}C_y$ random alloys, which for moderate amounts of carbon is lower than in pure silicon. FIG. 20 the schematic of the device layers and the corresponding energy-band diagram.

Absorption Region of Avalanche HIP Devices on Germanium Substrates

HIP devices built on Ge bulk substrates can take advantage of the extremely high electron mobility values to sharply increase the free-carrier absorption and thus the detectivity and signal-to-noise ratio. As a reminder, the electron mobility in bulk Ge is about 3900 $cm^2$/V-s, while in bulk silicon is only 1500 $cm^2$/V-s. This is one of the driving forces behind a renewed interest on Ge substrates for advanced CMOS technology.

Therefore, Ge-based n-type HIP devices are extremely promising for MWIR and LWIR. Electron mobility is a function of effective electron mass: the lower the effective mass, the higher the mobility.

For Ge <111> substrates, the longitudinal mass is 1.64 $m_0$ and the transversal mass is 0.082 $m_0$.

Another extremely important advantage of germanium substrates is the feasibility of fabricating short-period strained-layer superlattices incorporating Gray-Tin (α-Sn). Theoretical work shows that several superlattice compositions have direct bandgaps, on <111> and also on <100> germanium substrates.

Strained to Ge <111> substrates, a direct bandgap can be obtained with several $Sn_1Ge_n$ superlattice configurations, including "n"=3, that is, $Sn_1Ge_3$. Strained to Ge <100> substrates, a direct bandgap can be obtained with several superlattice $Sn_2Ge_n$ configurations, including "n"=2, that is, $Sn_2Ge_{10}$. $Sn_1Ge_3$ superlattice are easier to grow on <111> Ge substrates than $Sn_2Ge_{10}$ to grow on Ge <100> substrates.

$Sn_1Ge_3$ grown on Ge <111> substrates could be easier to fabricate and include in different types of electronic and opto-electronic devices. For this configuration the smallest bandgap is about 0.22 eV, which is small enough for the detection of MWIR through band-to-band transitions. Therefore, only LWIR and/or VLWIR sensing requires the fabrication of HIP devices.

The hole effective masses for bulk Ge are $m_{hh}$=0.256 $m_0$, $m_{lh}$=0.044 $m_0$. These bands are degenerate and therefore the advantages of the very low light-hole mass cannot be fully taken advantage of. For the $Sn_1Ge_3$ superlattices on Ge <111> substrates, in the plane perpendicular to the direction of epitaxial growth, the two lowest hole-subbands have masses of only 0.078 $m_0$, and 0.072 $m_0$, and these two subbbands are not degenerate, thereby suppressing scattering.

The electron effective mass for bulk Ge is 0.082 $m_0$, with 8 degenerate valleys. For the $Sn_1Ge_3$ superlattices on Ge <111> substrates, the minimum of the conduction-band is at the Γ-point (direct bandgap), and the electron mass is 0.046 $m_0$, in the plane perpendicular to the direction of epitaxial growth, and 0.053 $m_0$ in the direction parallel to the epitaxial growth.

Therefore, it can be concluded that the fabrication of $Sn_1Ge_3$ superlattices on Ge <111> substrates are not only advantageous for devices based on band-to-band transitions across a very small (0.22 eV) direct bandgap, but also for devices based on free carrier absorption, both in the valence-band and conduction-band. The 0.22 eV gap is not a pseudo-direct bandgap formed by zone-folding, but it is a truly direct bandgap.

Because the band alignments of these alloys and superlattices, strained to Ge substrates are not quantitatively well known, the schematic energy-band diagrams of FIGS. 17, 18, 19, and 20, depict desirable qualitative alignments. Once the accurate data about these alignments becomes publicly available, it will be possible to make quantitative energy-band diagrams similar to those shown for the SiGeC random alloys and superlattices on silicon substrates.

Front-Side Illumination Versus Back-Side Illumination

For silicon substrates, all the alloys and superlattices have bandgaps such that band-to-band transitions are impossible for photons with wavelengths longer than SWIR. For this reason, the question of Front-Side and Back-Side illumination for MWIR and LWIR is irrelevant. Therefore the HIP heterojunction can be formed near the top electrode or the bottom electrode.

For germanium substrates, very small direct bandgaps can be made. For example, the $Sn_1Ge_3$ superlattice has a direct bandgap of 0.22 eV, which is small enough for a PIN device to cover the entire MWIR range. Therefore, the question of Front-Side versus Back-Side Illumination for such particular device and wavelength is relevant because the photo-absorption and carrier injection could take place from the undesirable side of the avalanche region.

HIP devices on Ge substrates for LWIR and VLWIR, are not affected by the issues of Front-Side versus Back-Side Illumination.

Profiles for Combined PIN & HIP Devices

Previous sections of the present disclosure, described the optimized profiles for PIN devices implemented on silicon or germanium substrates, separately from the optimized profiles for HIP devices implemented on silicon or germanium substrates. For both devices, there were profiles for Front-Side or Back-Side Illumination configurations.

In the present section it will be described how the device layer requirements for optimal performance of PIN and HIP devices can be met simultaneously. The combined requirements result in heterojunction and doping profiles, suitable to be implemented on silicon or germanium substrates, for Front-Side or Back-Side Illumination configurations.

Both device types will be coupled to avalanche regions, thereby resulting in Separate Absorption and Multiplication (SAM) regions for Avalanche PIN devices and Avalanche HIP devices. The absorption regions for both devices are made on top of identical avalanche layers.

The physical mechanism for the photo-absorption of PIN and HIP devices are quite different, but their absorption layers are engineered together so that a single set of epitaxial layers can function for both absorption mechanisms, depending only on the applied voltage.

The HIP device will be n-type if the PIN absorption layer is p-type doped, and it will be p-type if the PIN absorption layer is n-type doped. These combinations of PIN & HIP devices also mean that for each combination both devices inject the same type of carrier into the avalanche region.

Regarding the absorption region of the PIN device, the most important parameters are the magnitude and nature (direct or indirect) of the bandgap, as well as the existence of a drift field (built-in or not) to drive the photo-generated carriers towards the avalanche region. For p-type absorption regions, the photo-generated carriers are electrons, and therefore the drift field for electrons is made with a slope in the conduction-band edge. For n-type absorption regions, the photo-generated carriers are holes, and therefore the drift field for holes is made with a slope in the valence-band edge. Building slopes in the conduction-band or valence-band of the absorption layer of a PIN device can be achieved through the grading of the bandgap, through graded alloy compositions, and also through the grading of the doping profile.

Because the HIP device operates through free carrier absorption, its heterojunction needs to be placed rather closely to a layer with high free carrier concentration, such as a highly doped layer or an undoped layer populated through modulation doping.

For the purpose of combining a HIP device with a PIN device, the heterojunction of the HIP device is placed at the interface between the avalanche region and the absorption region of the PIN device.

When the PIN device has a p-type absorption layer, then the HIP device will be p-type and its heterojunction is formed in the valence-band. When the PIN device has a n-type absorption layer, then the HIP device will be n-type and its heterojunction is formed in the conduction-band.

The construction of the heterojunction for the HIP device is done only in the same band (conduction or valence) that is highly doped for the PIN device, while the "other" band edge can be smooth. For that reason the insertion of the heterojunction for the HIP device does not interfere with the injection of photo-generated minority carriers from the absorption layer of the PIN device into the avalanche region.

Front-Side Illumination on Si Bulk Substrates

PIN on n+ Active Area, Having p-Type Absorption Layer (p-i-p HIP Device)

Starting from the interface with the substrate, the films to be deposited by the epitaxial process are:
 1. Avalanche layers, as already previously defined in the present disclosure.
 2. Undoped graded $Si_{1-x}Ge_x$ or $Si_{1-x-y}Ge_xC_y$. The thickness of this film is expected to be around 5 nm to 10 nm. The purpose of this film is to enable the engineering of the valence-band offset (barrier height for holes) between the previously grown undoped silicon film, part of the avalanche layers, and the next film to be grown: p+ $Si_{1-x-y}Ge_xC_y$. The presence of this film is entirely due to the need to reconcile conflicting requirements for the doping and heterojunction profiles of the p+ $Si_{1-x-y}Ge_xC_y$ layer to be grown next.
 3. In-situ p-type doped absorption layer and top electrode for both PIN and HIP: p+ $Si_{1-x-y}Ge_xC_y$.

Figure 22:
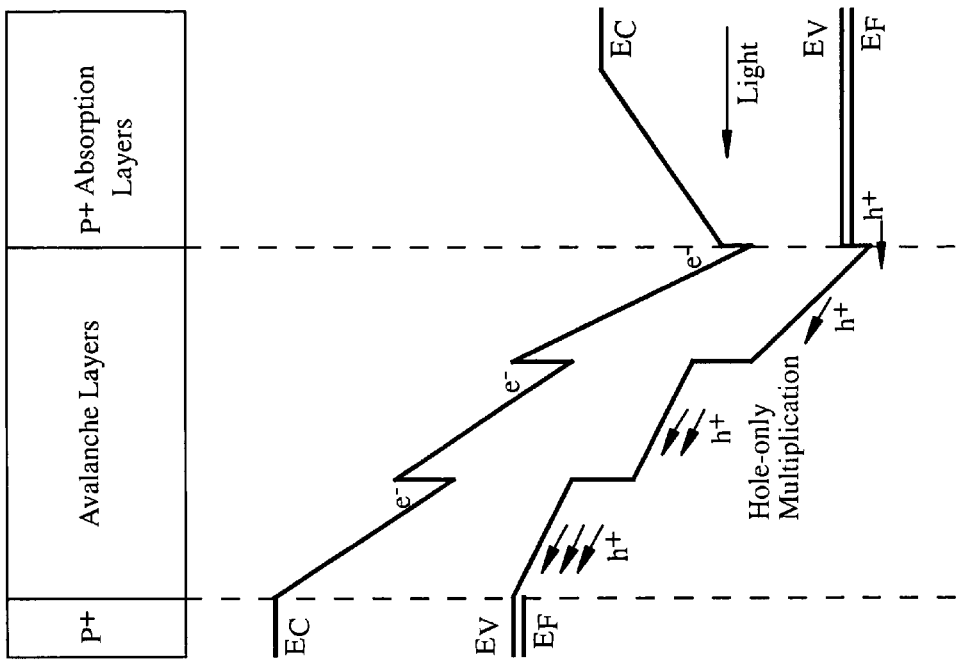
FIGS. 21 and 22 show the energy-band diagrams for combined PIN & HIP (p-i-p) devices side-by-side, as shown is FIG. 1, in which the epitaxial layer stack is designed for Front-Side Illumination, with p-type absorption layers.
Figure 21:
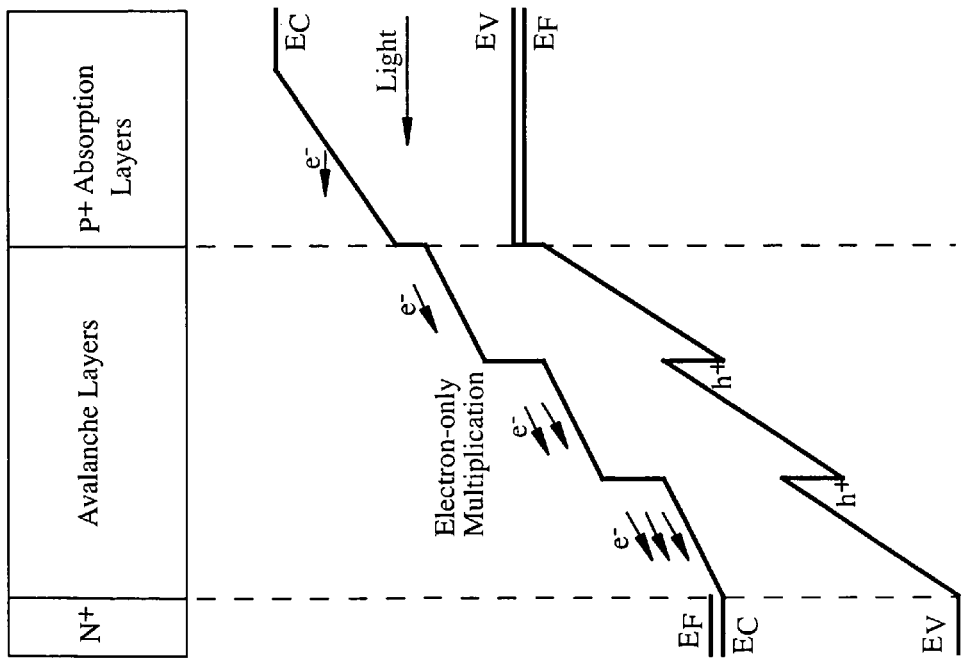

FIGS. 21 and 22 show the energy-band diagrams of the PIN & HIP (p-i-p) devices side-by-side, monolithically integrated with CMOS devices. The epitaxial layer stack was designed for Front-Side.

Illumination, with p-type absorption layers. In particular, FIG. 21 shows the energy-band diagram for the PIN device under suitable bias condition for operation in avalanche mode. The PIN device injects electrons into the avalanche region. FIG. 22 shows the energy-band diagram for the HIP device under suitable bias condition for operation in avalanche mode. The HIP device injects holes into the avalanche region. It can be seen that the heterojunction for the HIP device is placed right at the interface between the avalanche layers and the top electrode, that is, the p-type doped absorption layer of the PIN device. If the HIP device was not to be made, that heterojunction would not be formed. But even though it is there, it does impact the operation of the PIN device.

The requirements for PIN and HIP device layers conflict when wanting to increase the absorption coefficient and wavelength range of the absorbing layer for the PIN device, and wanting a HIP device capable of detecting photons in the 8-12 µm range. The conflict arises because for PIN devices the increase in the coefficient of absorption and detection of longer wavelengths require smaller band-gaps, which if accomplished mainly through the incorporation of more germanium in the SiGeC film, leads to larger valence-band offset with silicon. That would lead to a shorter wavelength cutoff of the HIP detector, because increasing the p+ doping of that layer might not be able to compensate the increase and valence-band offset. Shifting the position of the quasi-fermi level for holes inside the valence band of the p+ $Si_{1-x-y}Ge_xC_y$ to a deeper level (more degenerate) can compensate an increase in the valence-band offset. However, doping concentration can only be increased up to the limit of solid solubility of the dopant impurity in the $Si_{1-x-y}Ge_xC_y$ material.

The growth of this film should proceed with progressively increased percentages of Ge and C atoms. The grading does not have to be linear or uniform, but it should provide smooth conduction- and valence-band edges until the next interface. In principle the incorporation of this film should not affect the operation of PIN devices, as there should not be any significant impact (offset) on the conduction-band edge, between the previously grown undoped silicon film, and the next film to be grown: p+ $Si_{1-x-y}Ge_xC_y$.

PIN on p+ Active Area, Having n-Type Absorption Layer (n-i-n HIP Device)

Starting from the interface with the substrate, the films to be deposited by the epitaxial process are:

1. Avalanche layers, as already previously defined in the present disclosure.
2. Undoped graded $Si_{1-y}C_y$ or $Si_{1-x-y}Ge_xC_y$. The thickness of this film is expected to be around 5 nm to 10 nm. The purpose of this film is to enable the engineering of the conduction band offset (barrier height for electrons) between the previously grown undoped silicon film, part of the avalanche layers, and the next film to be grown: n+ $Si_{1-x-y}Ge_xC_y$. The presence of this film is entirely due to the need to reconcile conflicting requirements for the doping and heterojunction profiles of the n+ $Si_{1-x-y}Ge_xC_y$ layer to be grown next.
3. In-situ n-type doped absorption layer and top electrode for both PIN and HIP: n+ $Si_{1-x-y}Ge_xC_y$.

Figure 24:
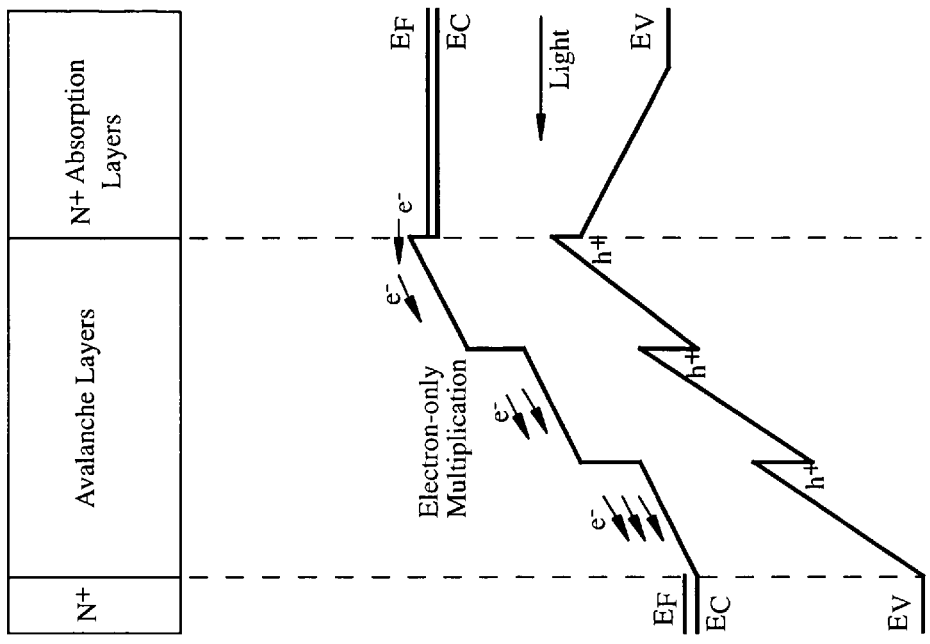
FIGS. 23 and 24 show the energy-band diagrams for combined PIN & HIP (n-i-n) devices side-by-side, as shown in FIG. 2, in which the epitaxial layer stack is designed for Front-Side Illumination, with p-type absorption layers.
Figure 23:
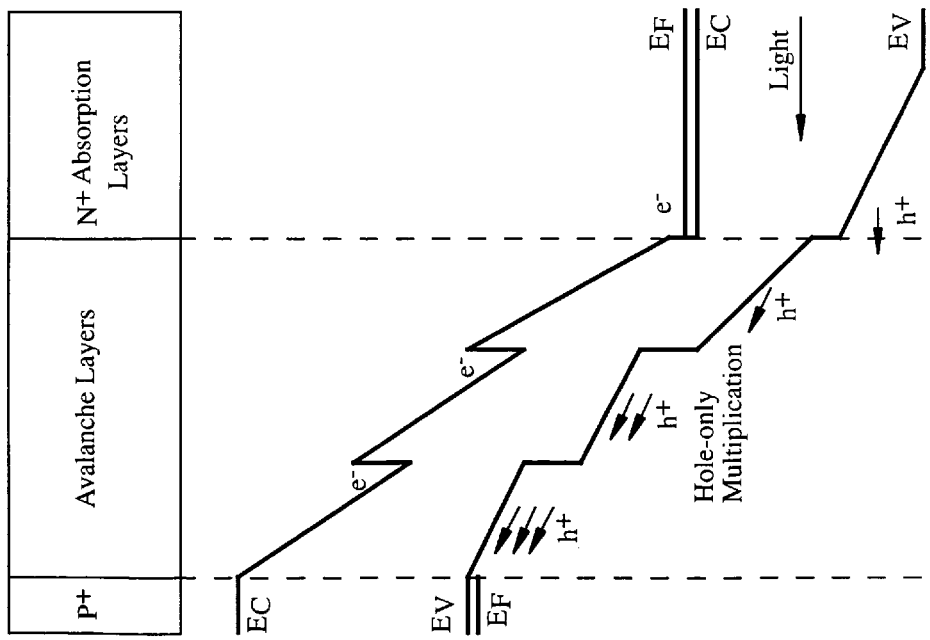

FIGS. 23 and 24 show the energy-band diagrams of the PIN & HIP (n-i-n) devices side-by-side, monolithically integrated with CMOS devices. The epitaxial layer stack was designed for Front-Side Illumination, with n-type absorption layers. In particular, FIG. 23 shows the energy-band diagram for the PIN device under suitable bias condition for operation in avalanche mode. The PIN device injects electrons into the avalanche region. FIG. 24 shows the energy-band diagram for the HIP device under suitable bias condition for operation in avalanche mode. The HIP device injects holes into the avalanche region. It can be seen that the heterojunction for the HIP device is placed right at the interface between the avalanche layers and the top electrode, that is, the n-type doped absorption layer of the PIN device. If there was no intention of making a HIP device, that heterojunction would not be formed. But even though it is there, it is not supposed to impact the operation of the PIN device.

The requirements for PIN and HIP device layers conflict when wanting to increase the absorption coefficient and wavelength range of the absorbing layer for the PIN device, and wanting a HIP device capable of detecting photons in the 8-12 µm range. The conflict arises because for PIN devices the increase in the coefficient of absorption and detection of longer wavelengths require smaller band-gaps, which if accomplished mainly through the incorporation of more carbon in the $Si_{1-x-y}Ge_xC_y$ film, leads to larger conduction-band offset with silicon. That would lead to a shorter wavelength cutoff of the HIP detector, because increasing the n+ doping of that layer might not be able to compensate the increase and conduction-band offset. Shifting the position of the quasi-fermi level for electrons inside the conduction band of the n+ $Si_{1-x-y}Ge_xC_y$ to a deeper level (more degenerate) can compensate an increase in the conduction-band offset. However, doping concentration can only be increased up to the limit of solid solubility of the dopant impurity in the $Si_{1-x-y}Ge_xC_y$ material.

The growth of this film should proceed with progressively increased percentages of Ge and C atoms. The grading does not have to be linear or uniform, but it should provide smooth conduction- and valence-band edges until the next interface. In principle the incorporation of this film should not affect the operation of PIN devices, as there should not be any significant impact (offset) on the valence-band edge, between the previously grown undoped silicon film, and the next film to be grown: n+ $Si_{1-x-y}Ge_xC_y$.

Back-Side Illumination on Thin-Film SOI Substrates

Back-side illumination requires the absorption layer to be at the bottom of the epitaxial stack, because it is from there that light penetrates the sensor. Having to do the epitaxial growth of the absorption layer at the bottom of the stack for both PIN and HIP devices requires both active areas to have the same type of doping, and requires special care for the formation of the top electrode. Naturally a single epitaxial growth step cannot have simultaneous in-situ doping for n-type and p-type layers. Therefore, the formation of the top electrode requires more processing steps and alternative solutions:

1. Epitaxial growth of undoped top electrode film, followed by masked ion-implantation for the p-type electrodes, and masked ion-implantation for the n-type electrodes.
2. Epitaxial growth of in-situ doped top electrode film, followed by masked ion-implantation with complementary doping type. This implantation step must fully compensate and exceed the doping concentration introduced during the epitaxial growth.
3. The epitaxial deposition stops after the growth of the absorption and avalanche layers. Two masked selective or non-selective epitaxial growth steps will growth separately, the in-situ doped, n-type and p-type electrode layers.
4. The epitaxial deposition stops after the growth of the absorption and avalanche layers. The top electrode for both the PIN and HIP devices is a metal forming a Schottky junction on the undoped or slightly doped top epitaxial layer. A Schottky junction on undoped silicon can be viewed as a "neural" junction, because it is an equally good contact to extract electrons or holes. Because this Schottky junction is after the avalanche region, its role as a contact is only to extract carriers, electrons and/or holes. This Schottky junction should inject neither electrons nor holes into the avalanche region, and for that reason the barrier height should be nearly symmetric, i.e., the workfunction of the metal or metal-silicide forming the Schottky contact, should be near the midgap energy level of silicon.

It should be kept in mind that the requirements regarding heterojunction and doping profiles of the top electrode are not critical, and are far less sophisticated than those of the bottom electrode which is simultaneously the absorbing layer for both he PIN and HIP devices. The role of the top electrode in the operation of the PIN and HIP devices is only that of a charge collector. The Schottky heterojunction, with workfunction near the midgap of silicon prevents injection of electrons and holes into the avalanche region for any possible bias condition.

The metal forming the Schottky junction will act as a mirror for light that crosses the absorption layer and avalanche layers without being absorbed. This effect is not expected to be detrimental to the operation of the Avalanche PIN devices because it is supposed that almost all light is absorbed in the bottom-electrode-absorbing layer. On the other hand, for the HIP device, the existence of this mirror is expected to double its absorption capability, because typically only a few percent are absorbed with one pass through the absorbing layer.

Since the energy of the photons absorbed by the HIP device is far smaller than the bandgap of any of the layers in the absorption layer, as well as in the avalanche region, and smaller than the threshold for internal emission at the Schottky junction itself, there will be no carrier injection into the avalanche region other than the HIP heterojunction.

The Schottky junction as top electrode of PIN and HIP devices for Back-Side Illumination systems made on SOI or GeOI substrates, with provide the best solution from process complexity and device performance standpoints. For that reason, this is the solution depicted in the figures below. With this solution the PIN device is no longer a bipolar device, because it will become a "p-i-metal" or "n-i-metal" device. The HIP devices will become either "p-i-metal" or "n-i-metal" devices.

PIN with p-Type Absorption Layer (p-i-p HIP Device)

The active areas for the PIN and HIP devices are all p-type doped. Starting from the interface with the substrate, the films to be deposited by the epitaxial process are:
1. In-situ p-type doped absorption layer and top electrode for both PIN and HIP: p+ $Si_{1-x-y}Ge_xC_y$.
2. Undoped graded $Si_{1-x}Ge_x$ or $Si_{1-x-y}Ge_xC_y$. The thickness of this film is expected to be around 5 nm to 10 nm. The purpose of this film is to enable the engineering of the valence-band offset (barrier height for holes) between the previously grown p+ $Si_{1-x-y}Ge_xC_y$ films, and the next film to be grown: undoped silicon film, part of the avalanche layers. The presence of this film is entirely due to the need to reconcile conflicting requirements for the doping and heterojunction profiles of the p+ $Si_{1-x-y}Ge_xC_y$ layer to be grown previously.
3. Avalanche layers as previously defined herein.
4. Formation of a Schottky junction with a metal or a metal-silicide, having workfunction near the midgap value of silicon.

Figure 25:
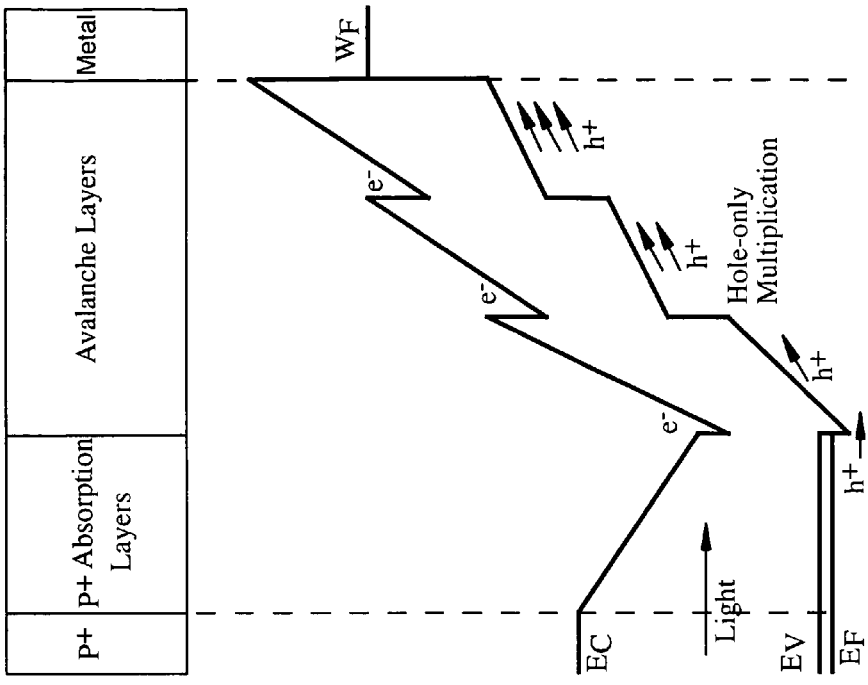
FIGS. 25 and 26 show the energy-band diagrams for combined PIN & HIP (p-i-metal) Schottky devices, as shown is FIG. 3, in which the epitaxial layer stack is designed for Back-Side Illumination, with p-type absorption layers.
Figure 26:
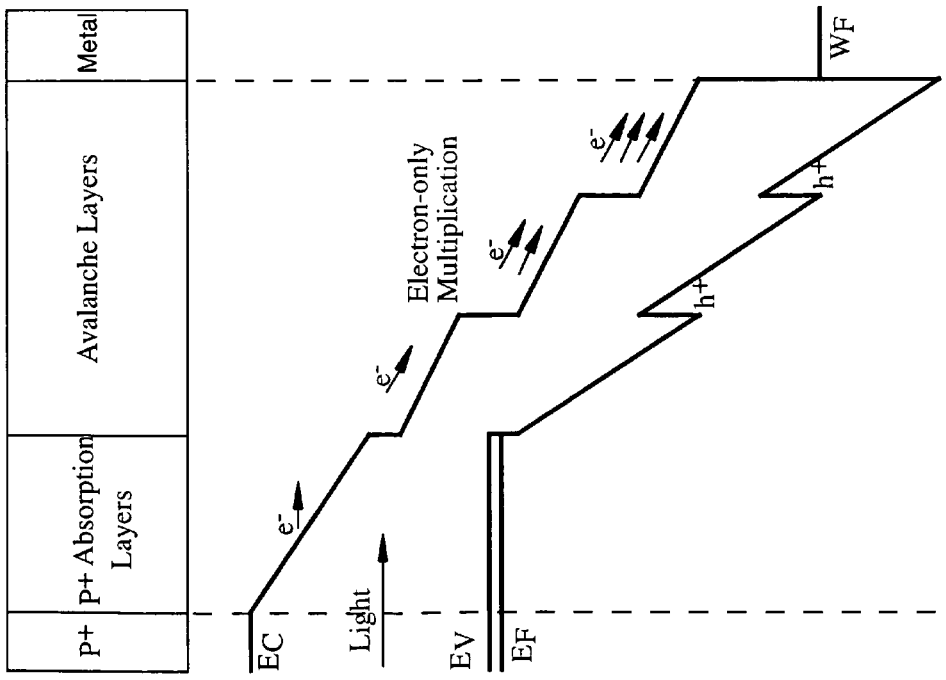

FIGS. 25 and 26 show the energy-band diagrams of the Schottky PIN & HIP (p-i-metal) devices side-by-side, monolithically integrated with CMOS devices. The epitaxial layer stack was designed for Back-Side Illumination, with p-type absorption layers. In particular, FIG. 25 shows the energy-band diagram for the P-I-Metal device under suitable bias condition for operation in avalanche mode. The P-I-M device injects electrons into the avalanche region.

FIG. 26 shows the energy-band diagram for the HIP (p-i-metal) device under suitable bias condition for operation in avalanche mode. The HP device injects holes into the avalanche region. It can be seen that the heterojunction for the HIP device is placed right at the interface between the avalanche layers and the bottom electrode, that is, the p-type doped absorption layer of the PIN (P-I-Metal) device. If there was no intention of making a HIP device, that heterojunction would not be formed. But even though it is there, it is not supposed to impact the operation of the PIN (P-I-Metal) device.

From FIGS. 25 and 26 it can be concluded that the exact same device can be operated as a PIN or a HIP device, depending only on the applied voltage.

PIN with n-Type Absorption Layer (n-i-n HIP Device)

Starting from the interface with the substrate, the films to be deposited by the epitaxial process are:
1. In-situ n-type doped absorption layer and top electrode for both PIN and HIP: n+ $Si_{1-x-y}Ge_xC_y$.
2. Undoped graded $Si_{1-y}C_y$ or $Si_{1-x-y}Ge_xC_y$. The thickness of this film is expected to be around 5 nm to 10 nm. The purpose of this film is to enable the engineering of the conduction band offset (barrier height for electrons) between the previously grown n+ $Si_{1-x-y}Ge_xC_y$ films, and the next film to be grown: undoped silicon film, part of the avalanche layers. The presence of this film is entirely due to the need to reconcile conflicting requirements for the doping and heterojunction profiles of the n+ $Si_{1-x-y}Ge_xC_y$ layer to be grown previously.
3. Avalanche layers as previously defined herein.
4. Formation of a Schottky junction with a metal or a metal-silicide, having workfunction near the midgap value of silicon.

Figure 28:
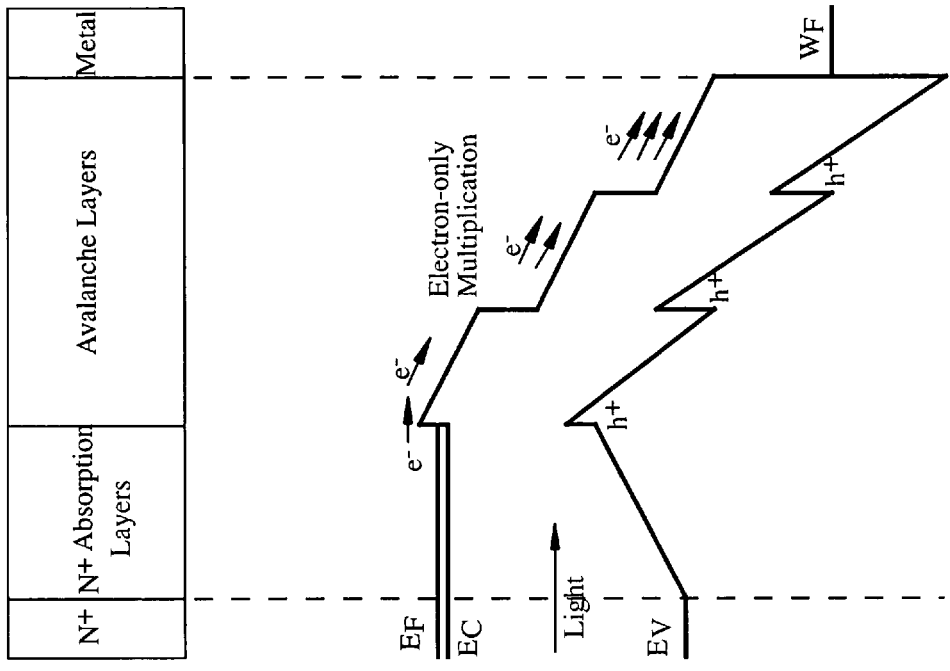
FIGS. 27 and 28 show the energy-band diagrams for combined PIN & HIP (n-i-metal) Schottky devices, as shown in FIG. 4, in which the epitaxial layer stack is designed for Back-Side Illumination, with n-type absorption layers.
Figure 27:
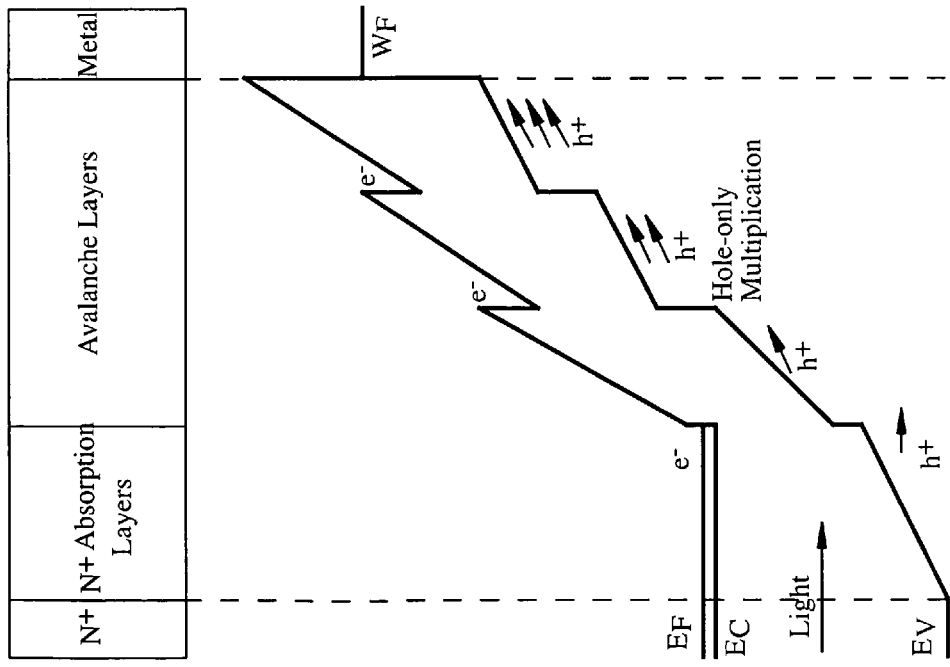

FIGS. 27 and 28 show the energy-band diagrams of the Schottky PIN & HIP (n-i-metal) devices side-by-side, monolithically integrated with CMOS devices. The epitaxial layer stack was designed for Back-Side Illumination, with n-type absorption layers. In particular, FIG. 27 shows the energy-band diagram for the N-I-Metal device under suitable bias condition for operation in avalanche mode. The N-I-Metal device injects holes into the avalanche region.

FIG. 28 shows the energy-band diagram for the HIP (n-i-metal) device under suitable bias condition for operation in avalanche mode. The HIP device injects electrons into the avalanche region. It can be seen that the heterojunction for the HIP device is placed right at the interface between the avalanche layers and the bottom electrode, that is, the n-type doped absorption layer of the PIN (N-I-Metal) device. If there was no intention of making a HIP device, that heterojunction would not be formed. But even though it is there, it is not supposed to impact the operation of the PIN (N-I-Metal) device.

From FIGS. 27 and 28 it can be concluded that the exact same device can be operated as a PIN or a HIP device, depending only on the applied voltage.

Back-Side Illumination with "Device-Layer Transfer" Front Si Substrates

Since "Device-Layer Transfer" results in turning the epitaxially grown layers "up side down", the required epitaxial profiles are identical to the ones deposited for Front-Side Illumination on Si bulk substrates.

Ge Substrates

Because the band alignments of GeSn and GeSiSn alloys and superlattices, strained to Ge substrates are not quantitatively well known, the schematic energy-band diagrams of FIGS. 21 to 28 depict the desirable qualitative alignments. Once the accurate data about these alignments becomes publicly available, it will be possible to make quantitative energy-band diagrams similar to those shown for the SiGeC random alloys and superlattices on silicon substrates.

HIT Cooler Devices on Top of PIN & HIP Devices

Back-side illumination enables increased functionality through further sophistication of the epitaxial device layers.

As already pointed out in WO/EP01/11817, the epitaxial deposition of the photo-detector layers, also enables, during the same epitaxial growth step, the formation of device layers for Heterojunction Integrated Thermionic (HIT) coolers. These devices provide a cooling effect of one of their sides (top or bottom) when under the suitable voltage conditions, and have been experimentally demonstrated with SiGeC/Si superlattices by X. Fan et al. (Appl. Phys. Lett., 78(11), pp. 1580, 12 Mar. 2001), thus making them fully compatible with the silicon processing.

Therefore, the advantages of the process flow disclosed in WO/EP01/11817 with respect to the monolithic integration of HIT coolers at the pixel level with the photo-detector layers, can be much improved for back-side illumination. In terms of process flow, the basic difference between front-side and back-side illumination lies with the profiles in the epitaxial layers, depending on which type of device is on top or at the bottom, and where the light comes from (top or bottom). In fact, it is more advantageous to have the HIT coolers monolithically integrated on substrates for back-side illumination, because the heat extraction will be performed from the top layer, i.e., through metal lines, rather than from the bottom through, i.e., through the bulk silicon substrate, which is a bad heat conductor.

The fabrication of the HIT devices can be very straightforward and low cost, because the epitaxial layers for the HIT devices can be made with the same epitaxial growth run used to make the PIN and HIP photo-diodes, without interruptions. In this case the bottom electrode of the HIT device is deposited after the undoped "buffer" layer is formed on top of the avalanche region.

This undoped "buffer" layer is necessary for the formation of the Schottky top electrode of PIN and HIP devices as explained earlier, and it also provides a separation between the avalanche region and the bottom electrode of the HIT device. The fabrication of the Schottky junction requires a patterning step in which the HIT layers are removed, with wet etching for example, from the areas in which the Schottky junction is to be formed. In the undoped "buffer layer" it is straightforward to embedded a sacrificial etch-stop marking layer, which will be removed before forming the Schottky junction itself.

The metal forming the Schottky junction will simultaneously be the top electrical contact of the PIN and HIP photo-diodes, and an "ohmic" contact to the highly doped bottom electrode of the HIT device layers.

Figure 29:
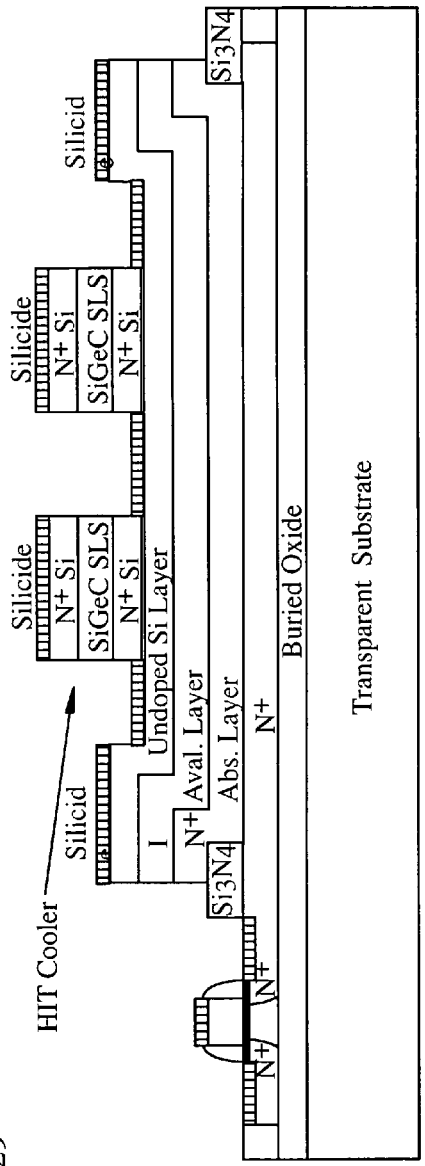
FIG. 29 shows the monolithic integration of HIT cooler devices, with CMOS devices, with Avalanche PIN and HIP devices. This configuration is suitable for Back-Side Illumination.

FIG. 29 shows the monolithic integration of HIT coolers with "Schottky PIN & HIP" devices made on active regions with the same type of doping on substrates for Back-Side Illumination.

HIT devices are unipolar, and can be implemented with heterojunctions in the valence-band or in the conduction-band, requiring only p-type doping or n-type doping respectively. Similar band-alignments can be engineered on germanium substrates, thus making possible the monolithic integration of PIN+HIP+HIT devices also on Ge substrates. From the point of view of silicon process technology, it is better to use n-type HIT coolers because the etching step to remove the HIT layers from the areas where the Schottky junctions are to be made, is very similar to the patterning of the n-type emitter layer in standard SiGe BiCMOS technology, which stops on the p-type SiGe base layer. Similarly, the marker layer embedded in the undoped "buffer" could also be a SiGe layer, having no electrical or optical function, being there just for the purpose of being an etch-stop layer.

The performance of HIT devices, i.e., the efficiency of cooling per unit of area, increases with decreasing area of the device. Therefore, the layout for the patterning of the HIT device layers can be such that for a certain total layer area (and thus total cooling power) is best achieved by having a number of devices in parallel, each with a small area, than a single device with a total area equaling the sum of all the areas of the small devices.

SOI and GeOI Image Sensors

The method of fabrication disclosed in WO 02/033755 is applicable to any of the photo-detector device structures mentioned above, because it adds the active layers to the substrate, regardless if it is Silicon or Germanium bulk, SOI or GeOI. This is the reason why it enables the fabrication of CMOS image sensors on Thin-Film SOI or Thin-Film GeOI substrates, which have many advantages over bulk silicon for the fabrication of advanced CMOS devices and circuits, in terms of performance, radiation hardness, fabrication flow, etc. However, that fabrication method makes the photo-diodes independent from, and not affected by, the details of the physics of the MOSFETs fabricated on such substrates.

One particular aspect of SOI (and GeOI) substrates that usually is not considered very relevant for the purely electrical CMOS circuits fabricated on SOI, is that the buried oxide in SOI wafers provides an excellent "marker" layer for the removal of the thick silicon substrate underneath the buried oxide. From a process technology standpoint, the presence of that "marker" layer makes it easy to replace the thick silicon substrate by a material that is transparent to visible and UV light. The replacement of silicon by a light-transparent material, such as quartz, sapphire, etc, can be done before or after the full processing of the front-side of the wafer.

Given the commercial availability of low-temperature processes for the removal and bonding to a new substrate, it is then preferable to perform the replacement after the processing of the front side, because it allows for the new light-transparent substrate to be made of materials that cannot withstand the high temperatures associated with the processing of the front-side of the wafer. Therefore, rather than quartz or sapphire, the new substrate could be a cheaper material such as glass, or for example plastic, which could be much lighter and even flexible.

"Thick-Film" SOI and GeOI substrates, share with "Thin-Film" SOI and GeOI substrates the advantages of back-side illumination, such as, wavelength filters made on the back of the buried oxide, and many metal levels with dense interconnects over the pixel areas at the front-side. However, with thicker crystalline silicon or germanium films on top of the buried insulator (typically silicon oxide), there is a stronger absorption of the shorter wavelengths in the visible, and UV. Therefore, beyond a certain thickness of the top silicon film, not enough photons of these wavelengths reach the epitaxial layers deposited on that film. For these reasons, it is more advantageous to use Thin-Film SOI and GeOI to fabricate the photo-detector devices described in WO/EP01/11817, and this will be the substrate of choice for all the exemplary implementations of the innovations described in the present section.

Thin-Film SOI or GeOI CMOS Image Sensors with Back-Side Illumination 1D or 2D array image-sensors, illuminated only from the back-side of the substrate, present new possibilities for a number of parameters and design options:

1. Wavelength filters are formed on the back of the "buried oxide" of the SOI wafer, once the silicon substrate has been removed, after all processing on the front-side of the wafer has been performed.

2. Suppression of cross talk between (sub)pixels due to photons impinging on the photo-detectors with wide angles (far from the normal to the substrate). This is a serious problem with conventional image sensors because the color dyes are placed on top of all metal and passivation layers, which might lead to restrictions on the number of metal layers used for image sensor ICs, which in turn could seriously limit the functionality of the design, because certain IP blocks, such as microprocessors or DSPs, require many metal layers.
3. Possibility of engineering ultra-shallow vertical and/or horizontal pn-junctions for selective UV absorption.
4. Enables PIN & HIP devices with metal (or metal-silicide) top electrodes, forming a Schottky junction on Si and/or SiGeC. In this configuration, the top metal electrode acts also as a mirror for the HIP device, thereby doubling its absorption capability.
5. Enables the fabrication of layers for the SiGeC/Si Heterojunction Integrated Thermionic (HIT) Coolers on top of the films for the PIN & HIP photo-detectors for "in-pixel" cooling, thus making possible to make ohmic and thermal contacts to the HIT devices from the top with metal layers, rather than extracting the heat through a silicon bulk wafer.
6. Dense interconnects over the area of the photo-detector films, just as if it were simple digital CMOS product. Dense interconnects at the front side, are expected to have a major impact on the overall architecture and design of the entire system, i.e., sensor plus digital logic, memory, etc.

Figure 30:
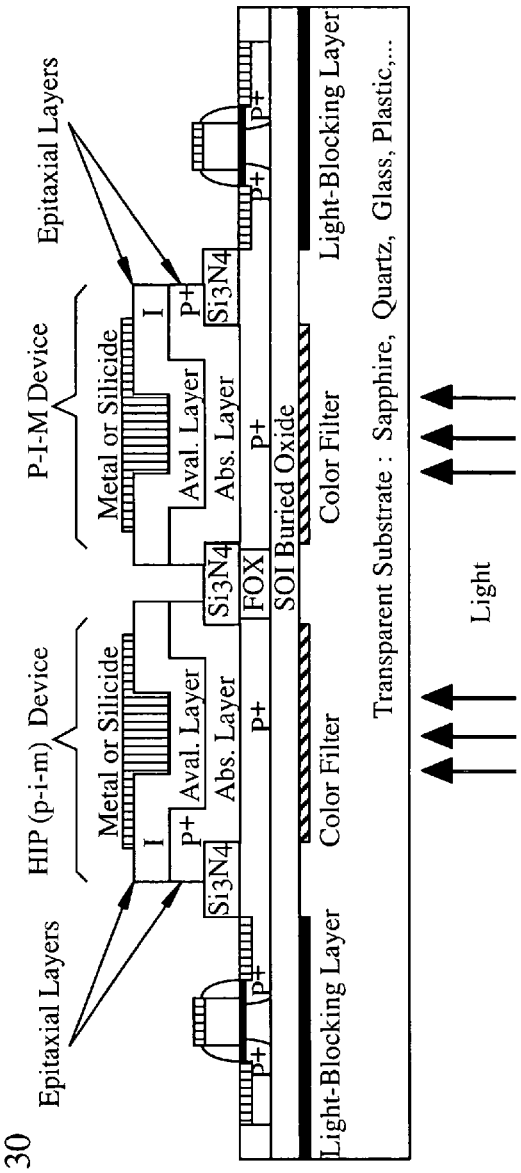
FIG. 30 shows an example of CMOS image sensors with Back-Side Illumination, made on Thin-Film SOI substrates. The PIN and HIP devices made on the same substrate are monolithically integrated with the CMOS devices.

FIG. 30 shows an example of a Back-Side Illumination configuration for CMOS image sensor made on Thin-Film SOI substrates. The PIN and HIP devices made on the same substrate are monolithically integrated with the CMOS devices.

Fabrication Flow

The following exemplary process flow is meant to illustrate the most important steps in the simultaneous fabrication of PIN & HIP devices along with the monolithic fabrication of Heterojunction Integrated Thermionic (HIT) coolers, on Thin-Film SOI substrates for back-side illumination.

The process steps for the fabrication of PIN & HIP devices together but without the HIT cooler are a subset of the process flow that includes the HIT cooler. The insertion of the process steps pertaining to the present invention take place near the end of what is known as the "Front End of the Line" (FEOL), that is, after all ion-implantation steps have taken place, and prior to the formation of silicide films to make ohmic contacts to the CMOS devices.

The electrical isolation between the active areas for CMOS devices and for the photo-diodes can be the standard one for the particular CMOS generation that the photo-diodes are monolithically integrated with. For such thin top silicon films (e.g. less than 20 nm), LOCal Oxidation of Silicon (LOCOS) process can be used because the "bird's beak" problem cannot develop. After completing the processing for metallization, the removal of the silicon substrate under the buried oxide takes place. The buried oxide of the SOI wafer is used as a marker for the removal process.

Before bonding the device layers to a transparent substrate, such as Sapphire, Quartz, Glass or Plastic, several processing options exist:
1. Fabrication of optical cavities for Resonant Cavity Enhanced (RCE) Photo-detection;
2. Fabrication of color filters for the several wavelengths, with conventional color dye;
3. Fabrication of Surface Plasmon Polariton (SPP) structures.

Surface Plasmon Polariton Structures (SPP) structures can be used for:
1. Wavelength filtering,
2. Polarization selectivity,
3. Coupling of light, especially of long wavelengths such as MWIR & LWIR, to pixels with sub-wavelength lateral dimensions.

Process Flow for PIN+HIP+HIT with Back-Side Illumination

This Process Flow shows the sequence of steps to fabricate PIN & HIP+HIT, with the PIN & HIP devices having a Schottky top electrode. In this flow it is also shown one possible way to fabricate a contact to the silicon thin-film on top of the buried oxide. The active area where the photo-diodes are to be made is separated of surrounding CMOS devices by Field Oxide (FOX) regions.

Figure 31:
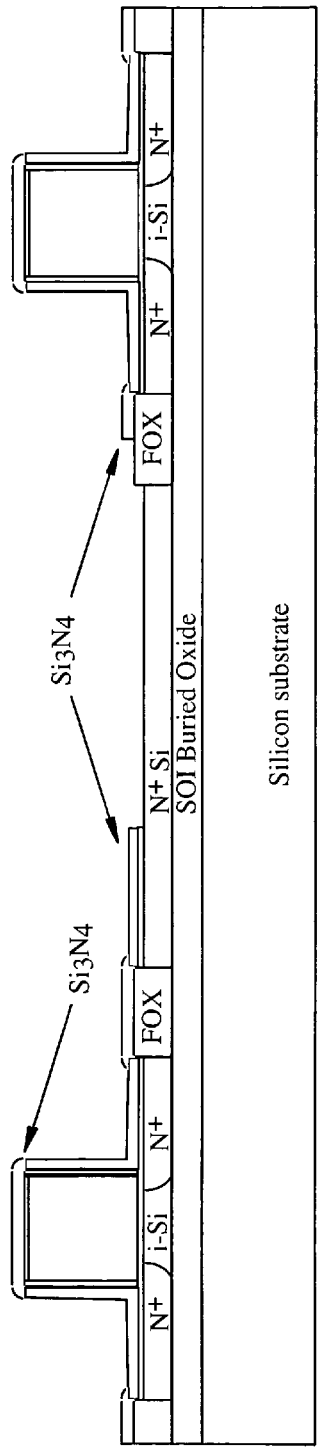
FIGS. 31 to 40 show an exemplary process flow for an implementation on Thin-Film SOI substrates for Back-Side Illumination.

FIG. 31 shows a schematic cross-section of a SOI wafer substrate (still with the silicon substrate underneath the buried oxide), after deposition and patterning of a silicon nitride ($Si_3N_4$) film covering the regions other than the active areas for photo-detectors. In this figure it shown (thick black line) is a very thin $SiO_2$ layer under the $Si_3N_4$ film, whose function is to prevent damage to the silicon surface from the etch process of the $Si_3N_4$ film.

Figure 32:
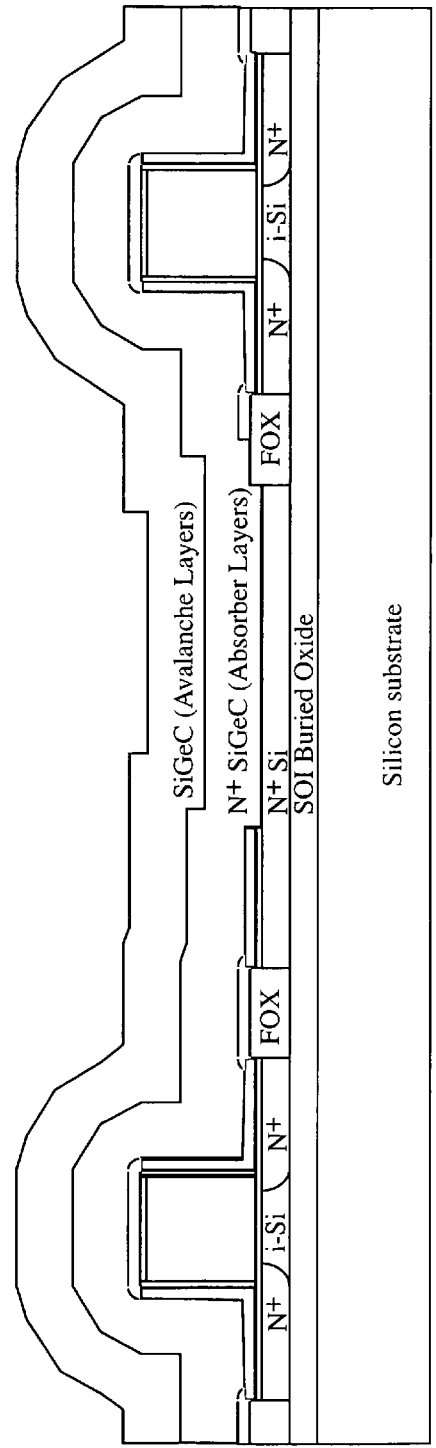

Epitaxial Deposition Module
1. Epitaxial deposition of the device layers for Schottky PIN & HIP devices and the layers for the HIP cooler. The epitaxial deposition process could be selective or non-selective. In this flow the epitaxial growth will be assumed to be non-selective, thus there will be deposition of amorphous or poly crystalline layers over the areas covered with a $Si_3N_4$ film. In the drawing it is shown an epitaxial growth that starts with in-situ doped layers and ends with undoped layers (FIG. 32).

Figure 33:
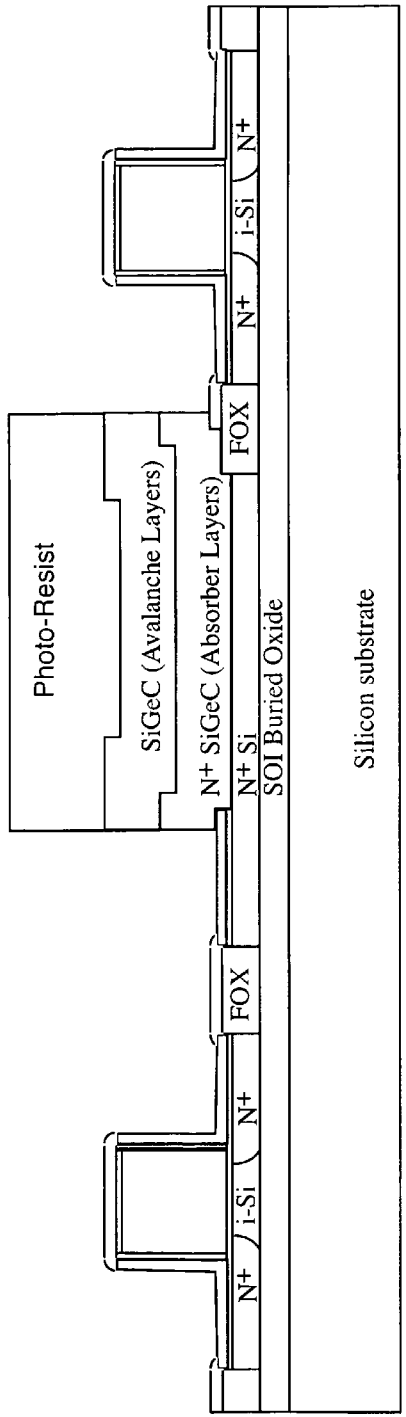

Patterning of HIT Devices
2. Photolithography, leaving photoresist only on the regions where the Si/SiGeC layers for the HIT coolers are not to be removed.
3. Selective etch (wet or dry) of Si/SiGeC layers of HIT cooler, stopping on the buffer layer before the layers of the avalanche region. This buffer layer may contain a marker layer, such as a germanium-rich layer, to provide an etch stop. For example a layer with high concentration of germanium may be incorporated during the epitaxial growth of the device layers (FIG. 33).

Figure 34:
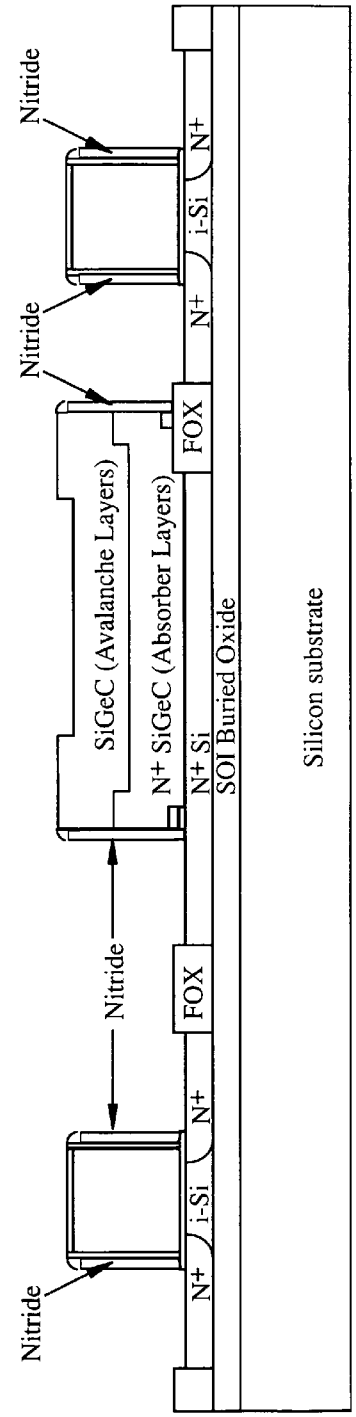

Patterning of PIN & HIP Devices
4. Photo-resist strip and clean.
5. Photolithography, exposing (removing photoresist) only from the regions where the amorphous or poly-crystalline Si & SiGeC layers are to be etched away.
6. Selective etch (wet or dry) of Si & SiGeC material, stopping on the $Si_3N_4$ film.
7. Selective etch (wet or dry) of $Si_3N_4$, stopping on $SiO_2$ (FIG. 34).

Figure 35:
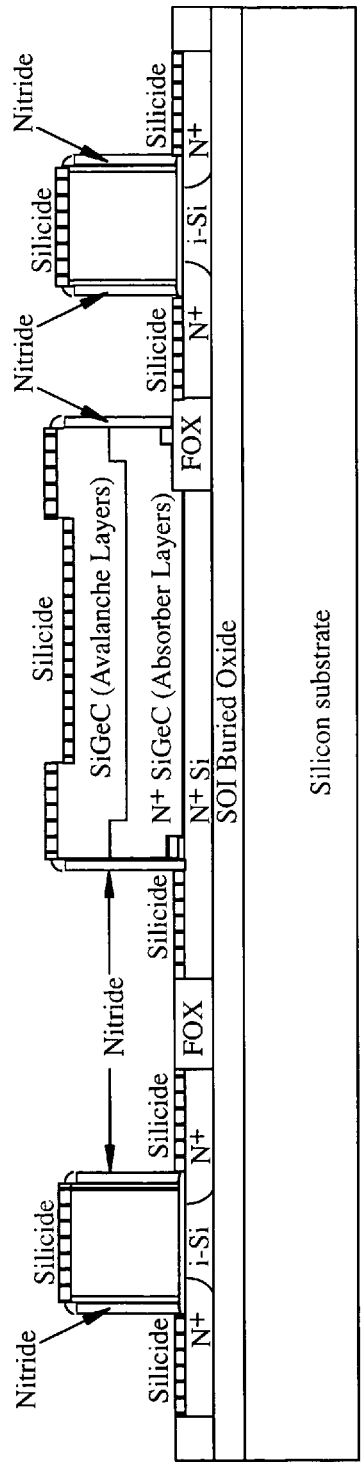

Spacer Module
8. Photo-resist strip and clean.
9. Deposition of $Si_3N_4$ film with thickness suitable to make spacers for the CMOS devices.
10. Etch-back of $Si_3N_4$, stopping on $SiO_2$ (FIG. 35).

Silicide Module
11. Removal of thin oxide layer from poly-Si lines and junctions (e.g. with Dilute-HF).

Figure 36:
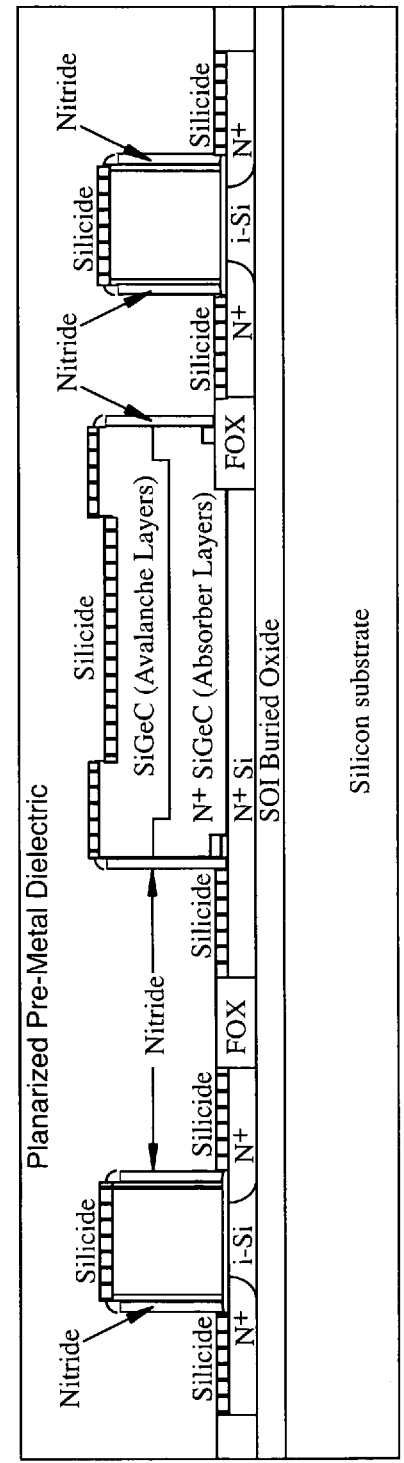

12. Formation of silicide with conventional methods/recipes (FIG. 36).

Figure 37:
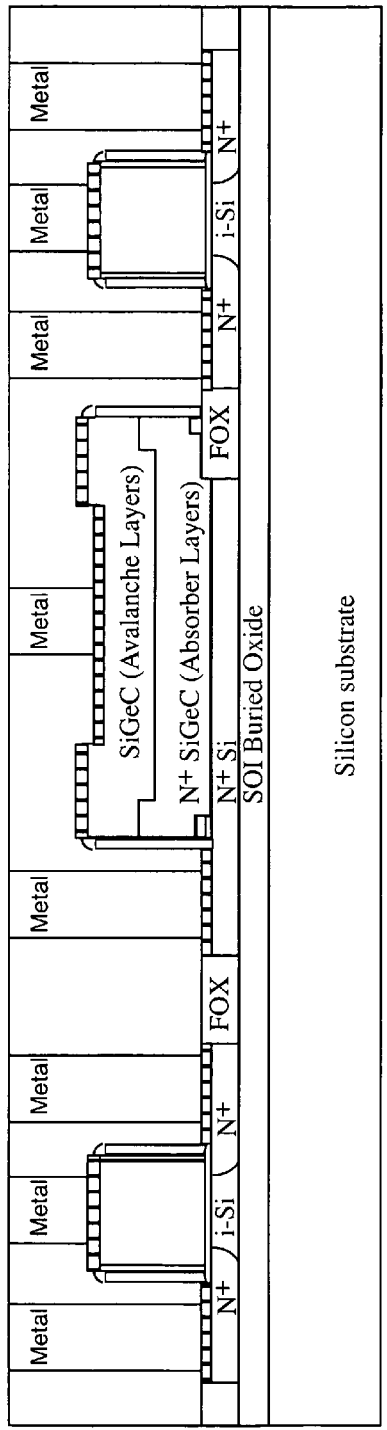

Planarization Module
13. Deposition of Pre-Metal Dielectric (PMD) layer stack.
14. Planarization of PMD layer stack by Chemical Mechanical Polishing (CMP). (FIG. 37).

Figure 38:
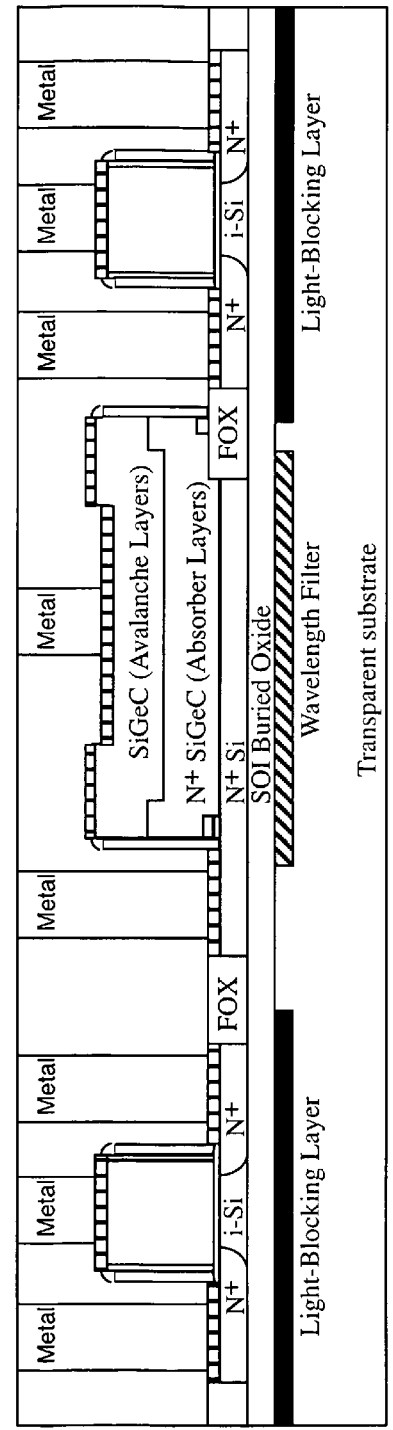

Standard Metallization
15. Patterning of contact holes.
16. Metal filling of contact holes.
17. CMP of metal (FIG. 38).
18. Full metallization of the front-side of the wafer (not shown in figures). Alignment markers for the patterning on the back-side can be made at a chosen metal level, in selected regions of the wafer.

Figure 39:
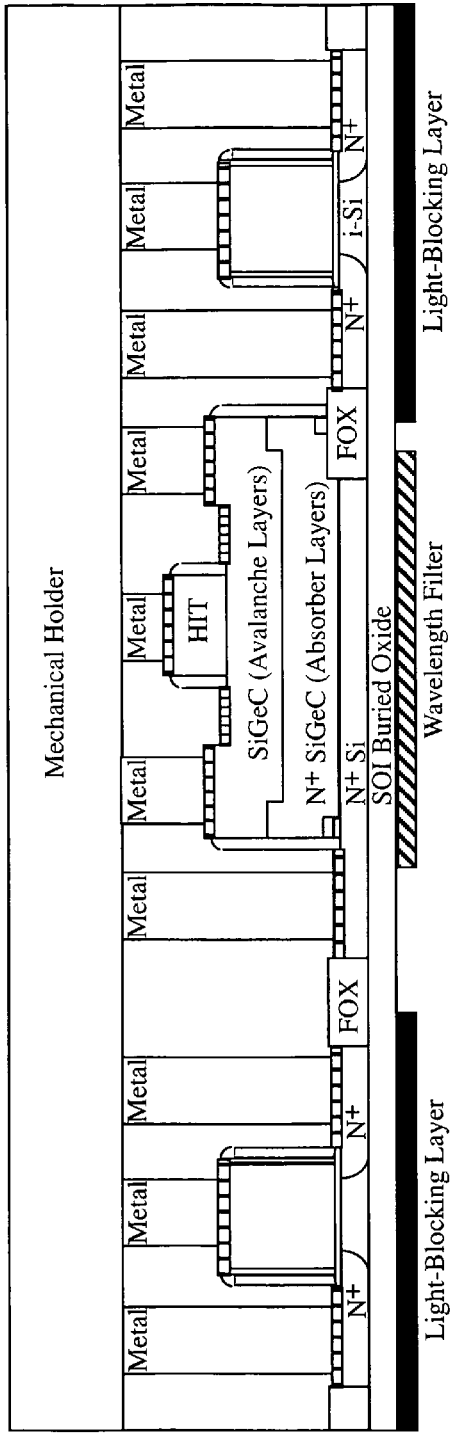

Wafer Back-Side Processing
19. Attachment of front-side of wafer to a mechanical holder
20. Removal of silicon substrate. The buried oxide provides a marking layer.
21. Fabrication of wavelength filters and light-blocking layers on the back-side of the buried oxide (FIG. 39).

Figure 40:
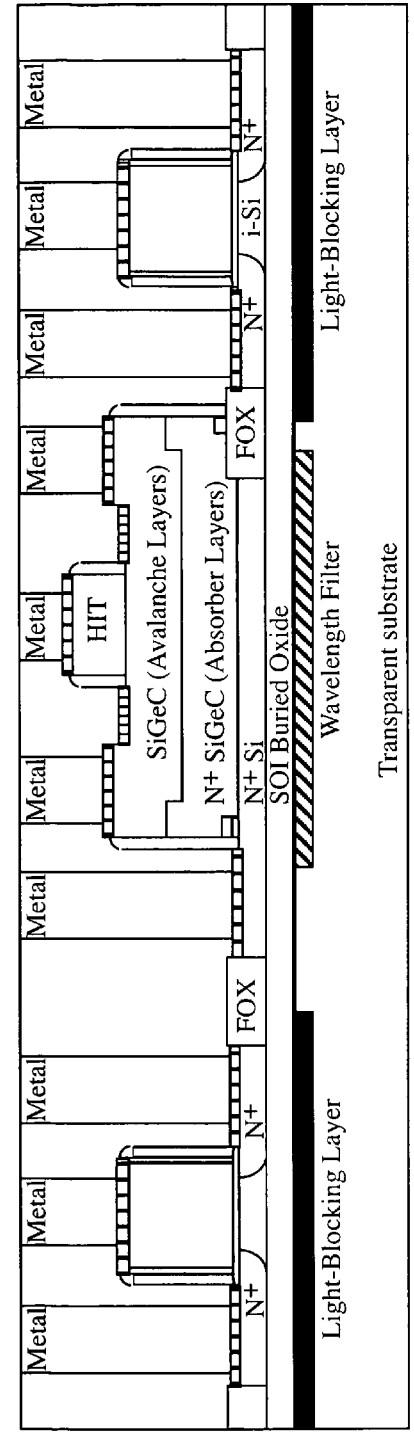

Wafer Back-Side Processing
22. Attachment of back-side of wafer to a transparent substrate.
23. Removal of mechanical holder (FIG. 40).

The invention claimed is:

1. A light-sensing device comprising a semiconductor substrate and photodiodes formed thereon, wherein the semiconductor substrate includes side-by-side active areas implanted therein and CMOS devices, said active areas having a defined polarity and said active areas being electrically isolated from one another and from the adjacent CMOS device by isolation regions, the photodiodes comprising photodiodes of a first type and of a second type, the photodiodes of the first and second types being formed in one single epitaxial growth step on said active areas.

2. A light-sensing device as claimed in claim 1, wherein the substrate is made of a material selected from the group comprising Silicon Bulk substrates, or Thick-Film Silicon-On-Insulator (SOI), or Thin-Film Silicon-On-Insulator (SOI), or Germanium Bulk substrates, or Thick-Film Germanium (GeOI), or Thin-Film Germanium-On-Insulator (GeOI).

3. A light-sensing device as claimed in claim 1, wherein the active areas are the bottom electrodes of epitaxially grown photodiodes.

4. A light-sensing device as claimed in claim 1, wherein the surface of the active areas is corrugated.

5. A light-sensing device as claimed in claim 1, wherein the epitaxially grown layers of the photodiodes are in contact with the side edges of the active areas underneath.

6. A light-sensing device as claimed in claim 1, wherein the epitaxially grown layers of the photodiodes cover the top edges of the isolation areas placed between active areas.

7. A light-sensing device as claimed in claim 1, wherein the bottom electrode and the epitaxial layers comprising a middle region and a top electrode, form devices operating in avalanche mode, such as Avalanche Photo-Diodes.

8. A light-sensing device comprising a semiconductor substrate and photodiodes formed thereon, wherein the semiconductor substrate includes side-by-side active areas implanted therein and CMOS devices, said active areas having a defined polarity and said active areas being electrically isolated from one another and from the adjacent CMOS device by isolation regions, the photodiodes comprising photodiodes of a first type and of a second type, the photodiodes of the first and second types being formed in one single epitaxial growth step on said active areas, wherein the photodiodes of the first type are grown on active areas having a predetermined first polarity and the photodiodes of the second type being grown on active areas having a second polarity that is opposite to said first polarity.

9. A light-sensing device as claimed in claim 8, wherein the substrate is made of a material selected from the group comprising Silicon Bulk substrates, or Thick-Film Silicon-On-Insulator (SOI), or Thin-Film Silicon-On-Insulator (SOI), or Germanium Bulk substrates, or Thick-Film Germanium (GeOI), or Thin-Film Germanium-On-Insulator (GeOI).

10. A light-sensing device as claimed in claim 8, wherein the active areas are the bottom electrodes of epitaxially grown photodiodes.

11. A light-sensing device as claimed in claim 8, wherein the surface of the active areas is corrugated.

12. A light-sensing device as claimed in claim 8, wherein the epitaxially grown layers of the photodiodes are in contact with the side edges of the active areas underneath.

13. A light-sensing device as claimed in claim 8, wherein the epitaxially grown layers of the photodiodes cover the top edges of the isolation areas placed between active areas.

14. A light-sensing device as claimed in claim 8, wherein the bottom electrode and the epitaxial layers comprising a middle region and a top electrode, form devices operating in avalanche mode, such as Avalanche Photo-Diodes.

* * * * *